(12) United States Patent
Cha et al.

(10) Patent No.: US 8,585,454 B2
(45) Date of Patent: Nov. 19, 2013

(54) DISPLAY DEVICE, METHOD OF MANUFACTURING THE SAME, AND MANUFACTURING THE SAME

(75) Inventors: Soon-wook Cha, Yongin-si (KR); Jin-koo Chung, Gyeonggi-do (KR); Joo-hyeon Lee, Yongin-si (KR); Jae-kook Ha, Yongin-si (KR); Jung-soo Rhee, Seoul (KR); Soo-yeon Lee, Yongin-si (KR); Seong-min Kim, Anyang-si (KR)

(73) Assignee: Samsung Display Co., Ltd. (KR)

( * ) Notice: Subject to any disclaimer, the term of this patent is extended or adjusted under 35 U.S.C. 154(b) by 127 days.

(21) Appl. No.: 12/898,111

(22) Filed: Oct. 5, 2010

(65) Prior Publication Data
US 2012/0018679 A1 Jan. 26, 2012

Related U.S. Application Data

(62) Division of application No. 11/618,146, filed on Dec. 29, 2006.

(30) Foreign Application Priority Data

Dec. 30, 2005 (KR) .......................... 10-2005-0135579
Feb. 22, 2006 (KR) .......................... 10-2006-0017116
Feb. 23, 2006 (KR) .......................... 10-2006-0017831

(51) Int. Cl.
*H01J 9/00* (2006.01)
*C09D 11/00* (2006.01)
*B05D 5/06* (2006.01)
*G02F 1/167* (2006.01)

(52) U.S. Cl.
USPC .......... 445/23; 427/66; 106/31.13; 106/31.65

(58) Field of Classification Search
USPC ................ 313/504, 506; 359/296; 106/31.13, 106/31.65; 427/66
See application file for complete search history.

(56) References Cited

U.S. PATENT DOCUMENTS

2005/0067949 A1 3/2005 Natarajan et al.

FOREIGN PATENT DOCUMENTS

| JP | 2004355913 | 12/2004 |
| KR | 1020030058791 | 7/2003 |
| KR | 1020040012484 | 2/2004 |
| KR | 1020050105057 | 11/2005 |

*Primary Examiner* — Joseph L Williams
(74) *Attorney, Agent, or Firm* — Cantor Colburn LLP

(57) ABSTRACT

A display device includes an insulating substrate, barriers surrounding predetermined regions on the insulating substrate, wherein ink composition is supplied in the predetermined regions, the ink composition including a first solvent which remains in a solid state in a temperature range between 10° C. and 30° C., a second solvent which remains in a liquid state in a temperature range between 10° C. and 30° C., and an organic material, and an organic layer formed in the predetermined regions by volatilizing the first solvent and the second solvent. Thus, the present invention provides a display device with an organic layer of regular quality.

13 Claims, 41 Drawing Sheets

DISPLAY DEVICE, METHOD OF MANUFACTURING THE SAME, AND MANUFACTURING THE SAME

This application is a divisional of U.S. application Ser. No. 11/618,146, filed on Dec. 29, 2006, which claims priority to Korean Patent Application No. 2005-0135579, filed on Dec. 30, 2005), Korean Patent Application No. 2006-0017116, filed on Feb. 22, 2006, and Korean Patent Application No. 2006-0017831, filed on Feb. 23, 2006, and all the benefits accruing therefrom under 35 U.S.C. §119, the contents of which in their entireties are herein incorporated by reference.

BACKGROUND OF THE INVENTION

1. Field of the Invention

The present invention relates to a display device, a method of manufacturing the same, and composition for use in manufacturing the same, and more particularly, to a display device having an organic layer of regular quality, a method of manufacturing the same, and composition for use in manufacturing the same.

2. Description of the Related Art

Recently, flat panel displays such as liquid crystal displays ("LCDs") and organic light emitting diodes ("OLEDs") have been widely used to replace existing cathode ray tubes ("CRTs").

An LCD includes an LCD panel having a first substrate on which thin film transistors ("TFTs") are formed, a second substrate disposed opposite to the first substrate, and a liquid crystal layer interposed between the first and second substrates. As the LCD panel does not emit light by itself, the LCD typically includes a backlight unit disposed behind the first substrate for providing light. The transmissivity of the light from the backlight unit may be adjusted according to the alignment of liquid crystals in the liquid crystal layer.

An OLED has low driving voltage, light weight and thinness, wide viewing angle, high speed response, and so on. The OLED may be classified into a passive matrix type and an active matrix type according to its driving method. Although the passive matrix type has a relatively simple manufacturing process, it has a demerit of rapid increase in power consumption for a display device with larger area and higher resolution. For this reason, the passive matrix type is mainly applied to a small-sized display device. In contrast, the active matrix type has a merit of a large screen and a high resolution although it has a relatively complicated manufacturing process.

The LCD and the OLED may include various organic layers such as a color filter layer, an organic semiconductor layer, a light emitting layer and so on, which are mainly formed using an inkjet method. The inkjet method allows an organic layer to be patterned without requiring processes of exposure, development, etching and so on, and has a merit of reducing the amount of organic materials used.

In the inkjet method, ink with an organic material dissolved therein is dropped into an area surrounded by partitions, and then is dried to form an organic layer. However, this method has a problem in that drying conditions of the ink vary depending on an order of the dropping, which may result in an organic layer of irregular quality.

BRIEF SUMMARY OF THE INVENTION

Accordingly, it is an aspect of the present invention to provide a display device with an organic layer of regular quality, by providing a display device which includes an organic layer formed by using ink including a first solvent which remains in a solid state at a normal temperature and a second solvent which remains in a liquid state at a normal temperature, and also by providing a display device which includes an organic layer formed by using a powder including the first solvent.

It is another aspect of the present invention to provide a method of manufacturing a display device with an organic layer of regular quality.

It is still another aspect of the present invention to provide composition for use in manufacturing a display device with an organic layer of regular quality.

The foregoing and/or other aspects of the present invention can be achieved by providing a display device including an insulating substrate, barriers surrounding predetermined regions on the insulating substrate, wherein ink composition is supplied in the predetermined regions, the ink composition including a first solvent which remains in a solid state in a temperature range between 10° C. and 30° C., a second solvent which remains in a liquid state in a temperature range between 10° C. and 30° C., and an organic material, and an organic layer formed in the predetermined regions by volatilizing the first solvent and the second solvent.

The second solvent may be volatilized before the first solvent is volatilized, and the first solvent may be volatilized after the first solvent changes into a solid state.

The display device may further include thin film transistors ("TFTs") formed on the insulating substrate, and pixel electrodes that are connected to the TFTs and surrounded by the barriers. The organic layer may be formed on the pixel electrodes.

The display device may further include a source electrode and a drain electrode, which are isolated from each other on the insulating substrate, with a channel region interposed between the source electrode and the drain electrode. The barriers may be formed to expose at least portions of the source electrode and the drain electrode, and the organic layer may be formed on the channel region.

The organic layer may be a semiconductor layer, at least one of a hole injecting layer and an organic light emitting layer, or a color filter layer.

The organic layer may have a substantially uniform thickness within each of the predetermined regions, with a variance of less than about 1 nm.

The foregoing and/or other aspects of the present invention can also be achieved by providing a display device including an insulating substrate, barriers surrounding predetermined regions on the insulating substrate, wherein powder composition is supplied in the predetermined regions, the powder composition including a solvent which remains in a solid state in a temperature range between 10° C. and 30° C., and an organic material, and an organic layer formed in the predetermined regions by removing the solvent.

The solvent may be removed using a vacuum after heating and liquefying the solvent.

The organic layer may be one of a semiconductor layer, a hole injection layer, an organic light emitting layer, and a color filter layer, and the organic layer may have a substantially uniform thickness within each of the predetermined regions, with a variance of less than about 1 nm.

The foregoing and/or other aspects of the present invention can be achieved by providing a method of manufacturing a display device, the method including making ink composition including a mixture of a first solvent which remains in a solid state in a temperature range between 10° C. and 30° C., a second solvent which remains in a liquid state in a temperature range between 10° C. and 30° C., and an organic material, volatilizing the second solvent in the ink composition, and forming an organic layer by volatilizing the first solvent in the ink composition in which the second solvent is volatilized.

Volatilizing the first solvent may include liquefying the first solvent by heating the ink composition which is in a solid state.

The method may further include forming pixel electrodes on the insulating substrate, wherein the organic layer is formed on the pixel electrodes, and the pixel electrodes may be at least partially surrounded by barriers.

Volatilizing the first solvent may include volatilizing the first solvent in a vacuum state.

The foregoing and/or other aspects of the present invention can also be achieved by providing a method of manufacturing a display device, the method including providing powder composition including a first solvent which remains in a solid state in a temperature range between 10° C. and 30° C., and an organic material, and forming an organic layer by removing the first solvent from the powder composition.

Providing the powder composition may include making ink composition including a mixture of the first solvent, a second solvent which remains in a liquid state in a temperature range between 10° C. and 30° C., and the organic material, and removing the second solvent from the ink composition.

Prior to removing the second solvent from the ink composition, the ink composition may be coated on a substrate and heated to remove the second solvent and form a solid film, and the method may further include powdering the solid film into particles to form the powder composition.

Removing the first solvent may include liquefying the first solvent by heating the powder composition, and removing the first solvent using a vacuum.

The method may further include forming barriers surrounding predetermined regions on an insulating substrate, and placing the powder composition in the predetermined regions surrounded by the barriers. Placing the powder composition in the predetermined regions may include using a shadow mask having openings formed corresponding to at least some of the predetermined regions.

The foregoing and/or other aspects of the present invention can be achieved by providing an ink composition for use in manufacturing a display device, the ink composition including a first solvent which remains in a solid state in a temperature range between 10° C. and 30° C., a second solvent which remains in a liquid state in a temperature range between 10° C. and 30° C., and an organic material.

The melting point of the first solvent may range from 30° C. to 200° C., and the boiling point of the first solvent may range from 200° C. to 500° C. The boiling point of the second solvent may range from 100° C. to 200° C.

The first solvent may range from 10 to 150 parts by weight with respect to 100 parts by weight of the second solvent, and the first solvent may range from 20 to 40 parts by weight with respect to 100 parts by weight of the second solvent.

The first solvent may include at least one of bibenzyl, 2,5-dibromo-p-xylene, 3,5-dibromo-toluene, 2-chloro-5-methylphenol, 4-chloro-2-methylphenol, 3-chloro-3-methylphenol, 5-chloro-2-methylphenol, 1-phenylpyrrole, 4H-pyran-4-one, 2,4,6-trichloropyrimidine, 2,3,4-trimethyl-1,3-pentanediol, dicafluorobiphenyl, 1,4-di-tert-butylbenzene, 2,6-di-tert-butyl-4-ethylphenol, 2,6-di-tert-butyl-ethylphenol, 2,6-di-tert-butylphenol, 2,4-di-tert-butylphenol, 2,5-dichloroaniline, and 3,5-dichlorocatechol.

The second solvent may include at least one of tetrahydrofuran, chloroform, N,N-dimethylformamide, 4-methylheptane, 1,4-dioxane, 1-propanol, cyclohexanone, decane, propylene carbonate, nonane, 4-methyl anisole, toluene, tetralin, diphenylether, 1,3-dichorobenzene, 2-pyrrolidone, aniline, benzene, benzonitrile, bromobenzene, chlorobenzene, cyclohexylbenzene, ethylbenzene, mesitylene, methylbenzonate, nitrobenzene, pyridine, and quinoline.

The organic material may include at least one of a hole injection material and an organic light emitting material.

The organic material may include at least one of derivatives comprising substituents of tetracene or pentacene; oligothiopene connected with 4, 5, 6, 7, or 8 carbons through positions 2 and 5 of thiopene ring; perylenetetracarboxlic dianhidride or its imide derivatives; naphthalenetetracarboxlic dianhydride or its imide derivatives; metallized pthalocyanine or its halogen derivatives; perylene or coroene or its derivatives having its substituents; co-oligomer or co-polymer of thienylene and vinylene; thiophene; thienylene or coroene, or its derivatives comprising its substituents; and derivatives comprising at least one hydrocarbon chain having 1 to 30 carbons connected to aromatic or heteroaromatic ring of the materials.

The foregoing and/or other aspects of the present invention can also be achieved by providing a powder composition for use in manufacturing a display device, the powder composition including a solvent which remains in a solid state in a temperature range between 10° C. and 30° C., and an organic material.

The melting point of the solvent may range from 30° C. to 200° C.

BRIEF DESCRIPTION OF THE DRAWINGS

The above and/or other aspects and advantages of the present invention will become apparent and more readily appreciated from the following description of the embodiments, taken in conjunction with the accompanying drawings of which:

FIGS. 3A to 3I are sectional views sequentially illustrating an exemplary method of manufacturing the exemplary OLED according to an exemplary embodiment of the present invention;

DETAILED DESCRIPTION OF THE INVENTION

Figure 1:
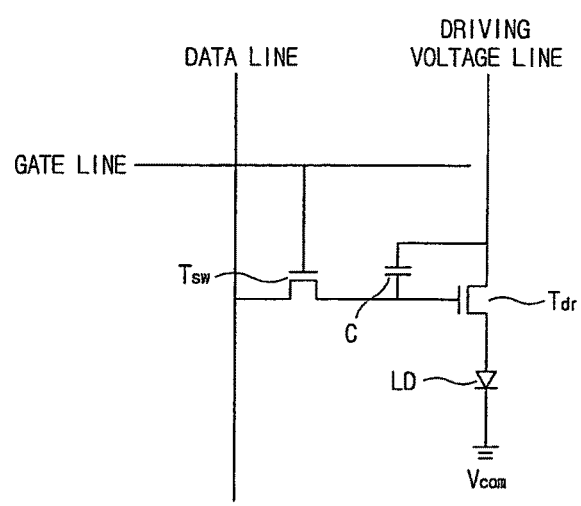
FIG. 1 is a circuit diagram of a pixel in an exemplary organic light emitting diode ("OLED") manufactured according to an exemplary embodiment of the present invention.

Reference will now be made in detail to exemplary embodiments of the present invention, examples of which are illustrated in the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In the following description, the term 'on' or 'over' has a meaning that a layer (film) may be interposed or not between two different layers (films), and the term 'immediately over' has a meaning that two different layers (films) contact each other directly. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Referring to FIG. 1, each pixel is provided with a plurality of signal lines. The signal lines include a gate line transmitting a scan signal, a data line transmitting a data signal, and a driving voltage line transmitting a driving voltage. The data line and the driving voltage line are disposed in parallel, adjacent to each other. The gate line extends perpendicular to the data line and the driving voltage line.

The pixel includes an organic light emitting element LD, a switching thin film transistor ("TFT") $T_{SW}$, a driving TFT Tdr, and a capacitor C.

The driving TFT Tdr has a control terminal, such as a gate electrode, connected to the switching TFT $T_{SW}$, an input terminal, such as a source electrode connected to the driving voltage line, and an output terminal, such as a drain electrode, connected to the organic light emitting element LD.

The organic light emitting element LD has an anode connected to the output terminal of the driving TFT Tdr, and a cathode connected to a common voltage Vcom. The organic light emitting element LD displays an image by emitting light varied according to the intensity of current outputted from the output terminal of the driving TFT Tdr. The current outputted from the driving TFT Tdr depends on a voltage difference between the control terminal and the output terminal of the driving TFT Tdr.

The switching TFT $T_{SW}$ also has a control terminal, such as a gate electrode, connected to the gate line, an input terminal, such as a source electrode, connected to the data line, and an output terminal, such as a drain electrode, connected to the control terminal of the driving TFT Tdr. The switching TFT $T_{SW}$ transmits the data signal applied to the data line to the control terminal of the driving TFT Tdr according to the scan signal applied to the gate line.

The capacitor C is connected between the control terminal and the input terminal of the driving TFT Tdr. The capacitor C is charged to maintain the data signal inputted to the control terminal of the driving TFT Tdr.

Now, an exemplary organic light emitting diode ("OLED") manufactured according to an exemplary embodiment of the present invention will be described with reference to FIG. 2.

Figure 2:
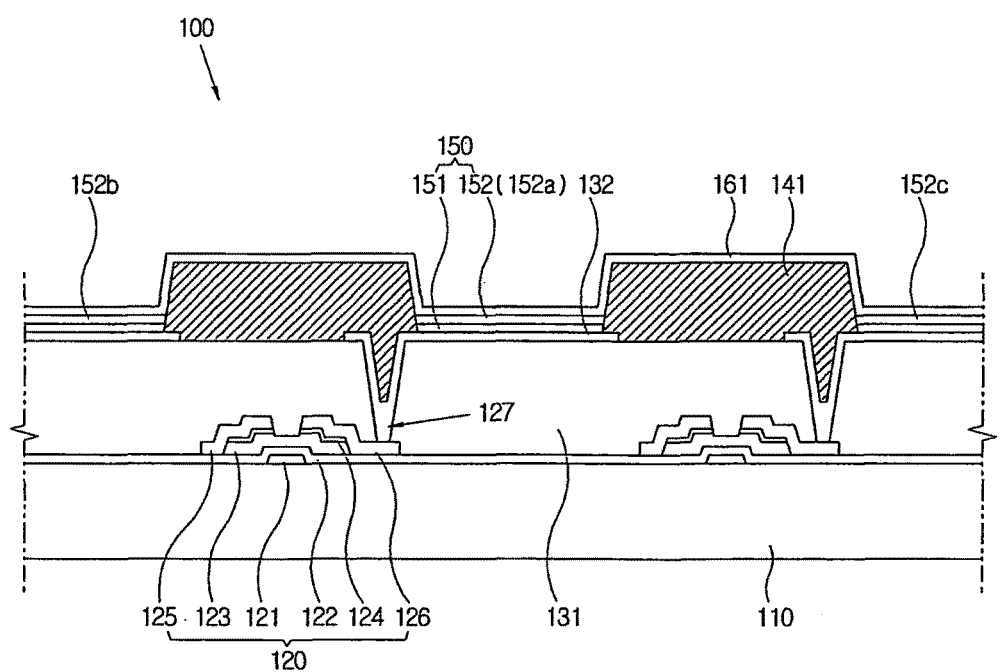
FIG. 2 is a sectional view of the exemplary OLED manufactured according to an exemplary embodiment of the present invention.

Referring to FIG. 2, an OLED 100 includes a TFT 120 formed on an insulating substrate 110, a pixel electrode 132 electrically connected to the TFT 120, and an organic layer 150 formed on the pixel electrode 132.

In this embodiment, the TFT 120 may include amorphous silicon ("a-Si"), but may alternatively include polysilicon.

A gate electrode 121 is formed on the insulating substrate 110, where the insulating substrate 110 may contain an insulating material such as glass, quartz, ceramic, plastic, or the like. The gate line (not shown) may also be formed on the insulating substrate 110, and the gate electrode 121 may extend from the gate line.

A gate insulating layer 122 made of silicon nitride (SiNx) or the like is formed on the insulating substrate 110 and the gate electrode 121. On a portion of the gate insulating layer 122 where the gate electrode 121 is located are formed a semiconductor layer 123 made of a-Si and an ohmic contact layer 124 made of n+ hydrogenated a-Si with heavily-doped n type impurities. Here, the ohmic contact layer 124 is divided into two portions by the gate electrode 121.

A source electrode 125 and a drain electrode 126 are formed on the ohmic contact layer 124 and the gate insulating layer 122. The source electrode 125 and the drain electrode 126 are separated from each other over the gate electrode 121 to form a channel there between.

A passivation layer 131 is formed on the source electrode 125, the drain electrode 126, and an exposed portion of the semiconductor layer 123, as well as on exposed portions of the gate insulating layer 122. The passivation layer 131 may be made of silicon nitride (SiNx) and/or organic material. A contact hole 127 to expose therethrough the drain electrode 126 is formed in the passivation layer 131.

The pixel electrode 132 is formed on the passivation layer 131 and contacts the drain electrode 126 through the contact hole 127. The pixel electrode 132, also termed an anode, provides holes to an organic light emitting layer 152 of the organic layer 150. The pixel electrode 132 is made of a transparent conductive material such as indium tin oxide ("ITO") or indium zinc oxide ("IZO") and is formed by a sputtering method. The pixel electrode 132 may have a pattern of an approximately rectangular shape in a top plan view, although deviations from such a shape are within the scope of these embodiments.

A barrier 141 is formed between the pixel electrode 132 and an adjacent pixel electrode. The barrier 141 distinguishes one pixel electrode 132 from another to define a pixel region, and is formed on the TFT 120 and the contact hole 127. Also, the barrier 141 serves to prevent the source electrode 125 and the drain electrode 126 of the TFT 120 from being shorted to the common electrode 161 formed on the barrier 141. The barrier 141 may be made of a photosensitive material with heat resistance and solvent resistance, such as acryl resin, polyimide resin or the like, or an inorganic material such as $SiO_2$, $TiO_2$ or the like, and may have a two-layered structure of an organic layer and an inorganic layer.

The organic layer 150 includes a hole injection layer 151 and the organic light emitting layer 152, and the hole injection layer 151 and the organic light emitting layer 152 are disposed on the pixel electrode 132 within the area defined by the barrier 141.

The hole injection layer 151 may be made of a mixture of polythiophene derivatives, such as poly(3,4-ethylenedioxythiophene) ("PEDOT") or the like, and polystyrene sulfonic acid ("PSS") and the like.

The organic light emitting layer 152 includes a red light emitting layer 152*a* emitting red color light, a green light emitting layer 152*b* emitting green color light, and a blue light emitting layer 152*c* emitting blue color light.

The organic light emitting layer 152 may be made of polyfluorene derivatives, (poly)paraphenylene vinylene derivatives, polyphenylene derivatives, polyvinylcarbazole derivatives and polythiophene derivatives or polymers thereof, which are doped with perillene group pigment, rhodamine group pigment, rubrene, perillene, 9,10-diphenylanthracene, tetraphenylbutadiene, nile red, cumarine 6, quinacridone, etc.

Holes from the pixel electrode 132 and electrons from the common electrode 161 are combined into excitons in the organic light emitting layer 152, and the excitons generate light.

The common electrode 161 is disposed on the barrier 141 and on the organic light emitting layer 152. The common electrode 161, also termed a cathode, provides electrons to the organic light emitting layer 152. The common electrode 161 may have a bi-layered structure of a calcium layer and an aluminum layer. In this case, it is preferable but not necessary that the calcium layer with a low work function is arranged at a side next to the organic light emitting layer 152.

A lithium fluoride layer may be formed between the organic light emitting layer 152 and the common electrode 161 since lithium fluoride can increase luminous efficiency depending on material of the organic light emitting layer 152. When the common electrode 161 is made of an opaque material such as aluminum or silver, light emitted from the organic light emitting layer 152 reflects off the common electrode 161 and travels toward the insulating substrate 110. In such an arrangement, the OLED 100 is called a bottom emission type.

Although not shown, the OLED 100 may further include an electron injection layer and an electron transferring layer interposed between the organic light emitting layer 152 and the common electrode 161. Also, the OLED may further include a passivation layer to protect the common electrode 161 and an encapsulation member to prevent moisture or air from infiltrating into the organic layer 150. The encapsulation member may include sealing resin and a sealing can.

Hereinafter, an exemplary method of manufacturing the OLED configured as above will be described with reference to FIGS. 3A to 3I. FIGS. 3B to 3I show only the insulating substrate 110 and the barrier 141 shown in FIG. 3A for the purpose of avoiding complexity of the description.

Figure 3A:
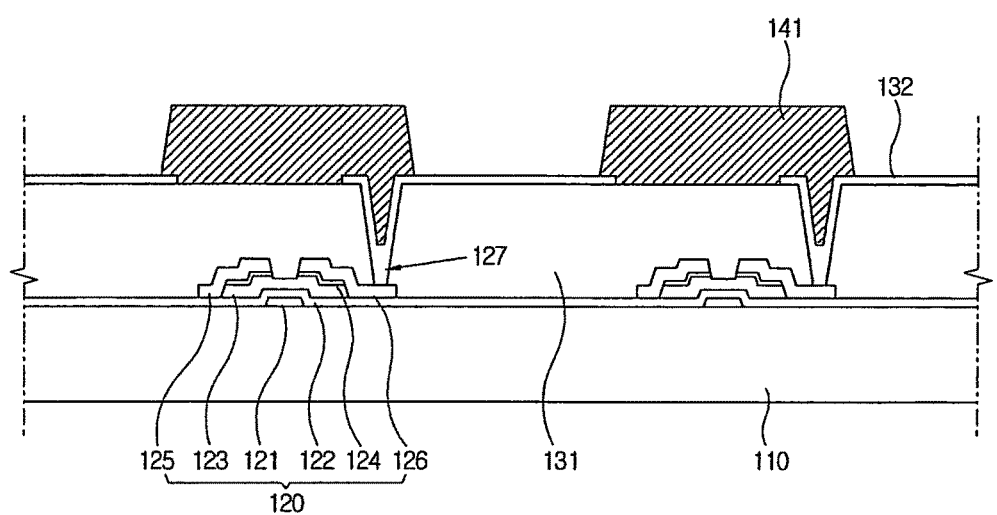

First, as shown in FIG. 3A, the TFT 120, the pixel electrode 132, and the barrier 141 are formed on the insulating substrate 110.

The TFT 120 whose channel part is made of a-Si may be manufactured by a known method.

Next, the passivation layer 131 is formed on the TFT 120 and on the exposed portions of the insulating substrate 110. The passivation layer 131 may be formed by a chemical vapor deposition ("CVD") method if it is made of silicon nitride, or may be formed by a spin coating method, a slit coating method or the like if it is made of an organic material. Thereafter, the passivation layer 131 is patterned to form the contact hole 127 to expose the drain electrode 126. Subsequently, the pixel electrode 132 is formed on the passivation layer 131 and in the contact hole 127 so as to be connected to the drain electrode 126 via the contact hole 127. The pixel electrode 132 may be formed by depositing ITO using a sputtering method and patterning it.

The barrier 141 may be formed by coating the pixel electrode 132 with a photosensitive material and exposing and developing the photosensitive material.

Figure 3B:
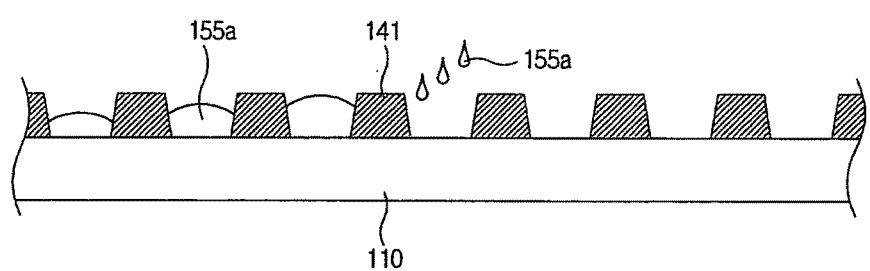

Thereafter, as shown in FIG. 3B, first hole injection ink 155a including a hole injection organic material and a solvent is dropped on the pixel electrode 132 using an inkjet process in order to form the hole injection layer 151. Since the first hole injection ink 155a is sequentially dropped on the pixel electrode 132, earlier dropped first hole injection ink 155a volatilizes more.

The hole injection organic material of the first hole injection ink 155a may include a mixture of polythiophene derivatives, such as poly (3,4-ethylenedioxythiophene) (PEDOT) or the like, and polystyrene sulfonic acid ("PSS") and the like.

The solvent of the first hole injection ink 155a includes a first solvent, which remains in a solid state in a temperature range between 10° C. to 30° C., and a second solvent, which remains in a liquid state in a temperature range between 10° C. to 30° C. The inkjet process is typically performed at a temperature close to a room temperature, that is, within a temperature range between 10° C. and 30° C., which maintains the first solvent alone in the solid state. It should be understood that the first solvent remains liquid in the first hole injection ink 155a when the first solvent is dissolved into the second solvent. That is, while the first hole injection ink 155a is dropped on the pixel electrode 132, the first solvent is still in a liquid state.

The second solvent rapidly volatilizes since it remains in the liquid state during the process. When the second solvent is removed from the first hole injection ink 155a, the first solvent is transformed into a solid state.

Figure 3C:
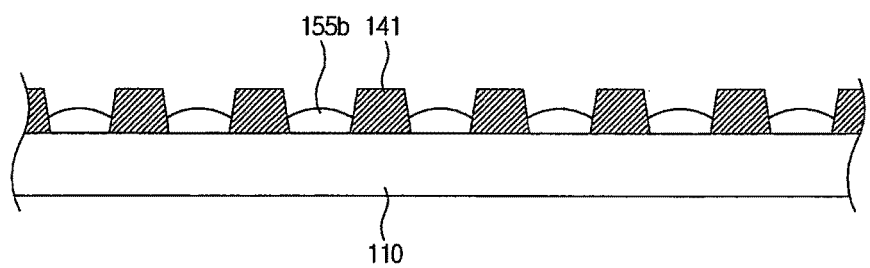

FIG. 3C shows the second hole injection ink 155b between the barriers 141. The second hole injection ink 155b is formed by removing the second solvent from the first hole injection ink 155a. The second hole injection ink 155b includes the first solvent and a hole injection organic material, but does not include the second solvent.

The second hole injection ink 155b without the second solvent has a regular height on the pixel electrode 132. This is because the first solvent of a high melting point does not substantially volatilize. In this condition, the second hole injection ink 155b remains in a solid state and accordingly is scarcely volatilized.

Hereinafter, the first and second solvents will be described in more detail.

It is preferable but not necessary that the melting point of the first solvent ranges from 30° C. to 200° C. If the melting point of the first solvent is less than 30° C., the first solvent may be liquefied during a process instead of remaining solid. On the contrary, if the melting point of the first solvent is more than 200° C., excessively high temperature is required for the liquification of the first solvent.

It is preferable but not necessary that the boiling point of the second solvent ranges from 100° C. to 200° C. If the boiling point of the second solvent is less than 100° C., the second solvent may be excessively volatilized during the ink jet process. On the contrary, if the boiling point of the second solvent is more than 200° C., the second solvent will not be volatilized well, thereby forming an uneven layer of the first hole injection ink 155a and making it difficult for the second hole injection ink 155b to have a regular height on all the pixel electrodes 132.

It is preferable but not necessary that the first solvent ranges from 10 to 150 parts by weight with respect to 100 parts by weight of the second solvent in the first hole injection ink 155a. If the first solvent is less than 10 parts by weight with respect to 100 parts by weight of the second solvent, the first solvent in the second hole injection ink 155b without the second solvent can not function well. On the contrary, if the first solvent is more than 150 parts by weight with respect to 100 parts by weight of the second solvent, the first solvent is precipitated as a solid in the inkjet process, which may damage an inkjet nozzle. More preferably, the first solvent ranges from 20 to 40 parts by weight with respect to 100 parts by weight of the second solvent.

The first solvent may include aromatic series including bibenzyl, 2,5-dibromo-p-xylene, 3,5-dibromo-toluene, 2-chloro-5-methylphenol, 4-chloro-2-methylphenol, 3-chloro-3-methylphenol, 5-chloro-2-methylphenol, 1-phenylpyrrole, 4H-pyran-4-one, 2,4,6-trichloropyrimidine, 2,3,4-trimethyl-1,3-pentanediol, dicafluorobiphenyl, 1,4-di-tert-butylbenzene, 2,6-di-tert-butyl-4-ethylphenol, 2,6-di-tert-butyl-ethylphenol, 2,6-di-tert-butylphenol, 2,4-di-tert-butylphenol, 2,5-dichloroaniline, 3,5-dichlorocatechol, etc.

The second solvent may include aliphatic compounds with 1 to 12 carbons or aromatic compounds with 6 to 20 carbons.

Aliphatic compounds with 1 to 12 carbons may include tetrahydrofuran, chloroform, N,N-dimethylformamide, 4-methylheptane, 1,4-dioxane, 1-propanol, cyclohexanone, decane, propylene carbonate, nonane, etc.

Aromatic compounds with 6 to 20 carbons may include 4-methyl anisole, toluene, tetralin, diphenylether, 1,3-dichlorobenzene, 2-pyrrolidone, aniline, benzene, benzonitrile, bromobenzene, chlorobenzene, cyclohexylbenzene, ethylbenzene, mesitylene, methylbenzonate, nitrobenzene, pyridine, quinoline, etc.

Figure 3D:
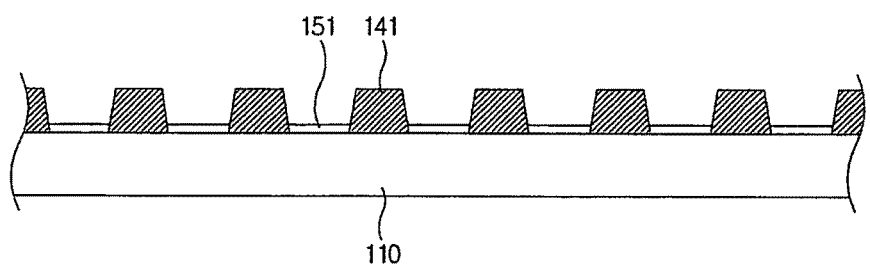

FIG. 3D illustrates a process of forming the hole injection layer 151 by drying the second hole injection ink 155b.

This process is achieved by liquidation and volatilization of the first solvent in the second hole injection ink 155b.

First, the second hole injection ink 155b having the first solvent in a solid state is heated. When the temperature of the second hole injection ink 155b exceeds the melting point of the first solvent, the second hole injection ink 155b is liquefied. At this time, the height (amount) of the second hole injection ink 155b on each pixel electrode 132 becomes regular.

Since the first solvent is dried in the condition that the height of the second hole injection ink 155b is regular, the second hole injection ink 155b is formed with uniform quality.

The second hole injection ink 155b may be dried at a low pressure of 1 Torr nitrogen atmosphere. If the pressure is too low, the second hole injection ink 155b may be at risk of sudden boiling.

After the drying process, it is preferable but not necessary that the second hole injection ink 155b may be subject to heat treatment at a temperature of about 200° C. for 10 minutes under a vacuum state. Solvent or water remaining in the hole injection layer 151 may be removed through this heat treatment.

Figure 3E:
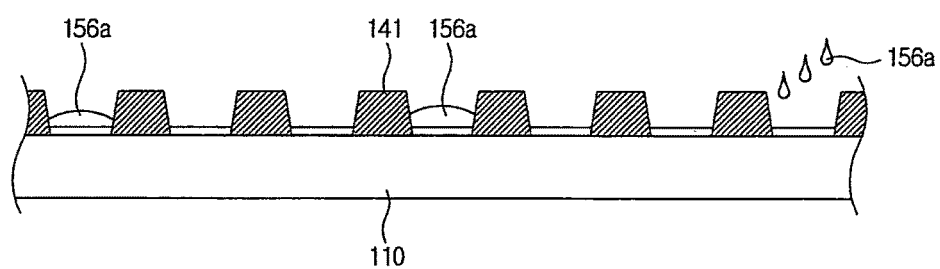
Figure 3F:
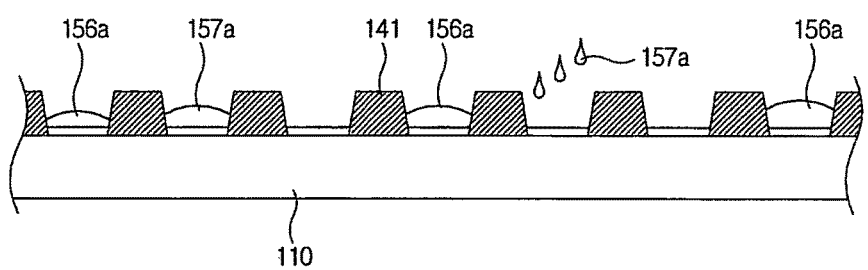
Figure 3G:
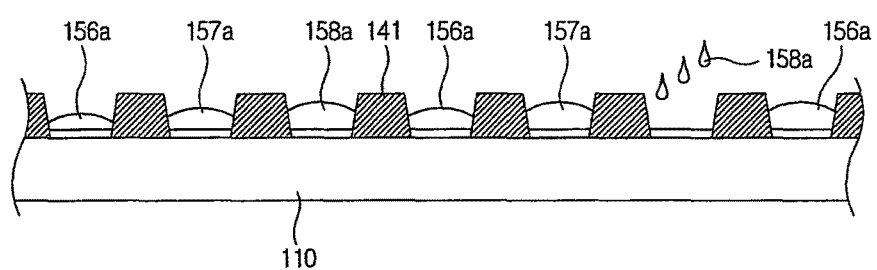

FIGS. 3E to 3G illustrate a process of forming the organic light emitting layer 152 by dropping a first red light emitting ink 156a, a first green light emitting ink 157a, and a first blue light emitting ink 158a on the pixel electrode 132 on which the hole injection layer 151 is formed.

Each of the first red, green, and blue light emitting inks 156a, 157a, and 158a includes the first solvent, which remains in a solid state in a temperature range between 10° C. and 30° C., and the second solvent, which remains in a liquid state within a temperature range of 10° C. to 30° C. Also, the first red, green, and blue light emitting inks 156a, 157a, and 158a includes a red light emitting material, a green light emitting material, and a blue light emitting material, respectively.

The first red, green, and blue light emitting inks 156a, 157a, and 158a are sequentially dropped by their colors, that is, for example, in a dropping order of the first red light emitting inks 156a shown in FIG. 3E, the first green light emitting inks 157a shown in FIG. 3F, and the first blue light emitting inks 158a shown in FIG. 3G. Such sequential dropping takes a long formation time and thus makes a difference in extents of drying between three light emitting inks greater than that of the first hole injection ink 155a. However, the difference between extents of drying is limitative since the first solvent remaining in the solid state at a room temperature is not dried.

Figure 3H:
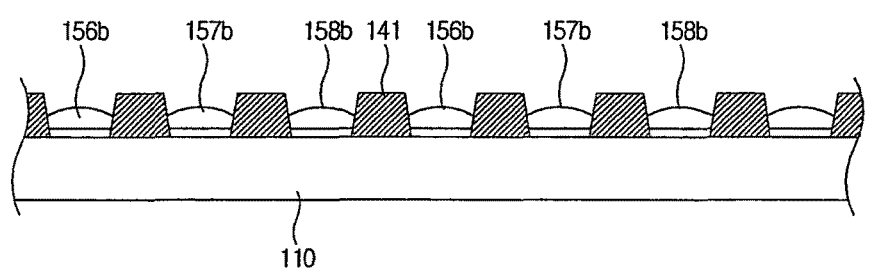
Figure 31:
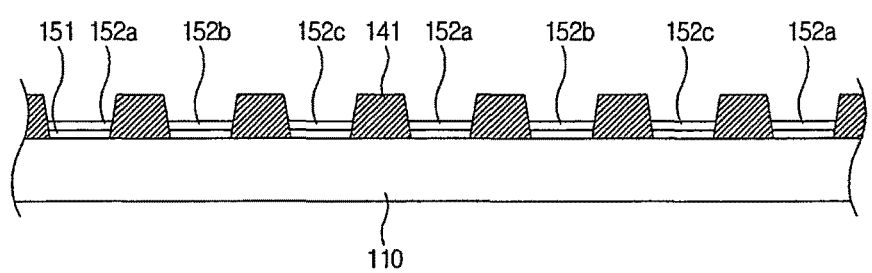

FIG. 3H shows that the second solvent is removed from the first red, green, and blue light emitting inks 156a, 157a, and 158a to form second light emitting inks 156b, 157b, and 158b on the hole injection layer 151. The second light emitting inks 156b, 157b and 158b include red, green, and blue light emitting materials, respectively, and the first solvent, but do not include the second solvent.

The second light emitting inks 156b, 157b, and 158b without the second solvent has a regular height on the hole injection layer 151. This is because the first solvent having a low melting point does not substantially volatilize. In this condition, the second light emitting inks 156b, 157b, and 158b remain in a solid state and accordingly are scarcely volatilized.

Thereafter, as shown in FIG. 3I, the second light emitting inks 156b, 157b, and 158b are dried to form the red light emitting layer 152a, the green light emitting layer 152b, and the blue light emitting layer 152c of the organic light emitting layer 152 in the same way as the second hole injection ink 155b is dried to form the hole injection layer 151.

Finally, the common electrode 161 is formed on the barriers 141 and the organic light emitting layer 152 to substantially complete the OLED 100 shown in FIG. 2.

Hereinafter, a thickness distribution of an organic layer in the OLED according to the exemplary embodiment of the present invention will be described with reference to FIGS. 4A to 4D.

Figure 4A:
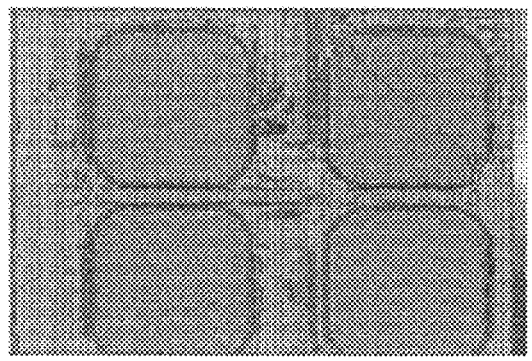
FIGS. 4A to 4D are views illustrating a thickness distribution of an exemplary organic layer in the exemplary OLED according to an exemplary embodiment of the present invention.
Figure 4B:
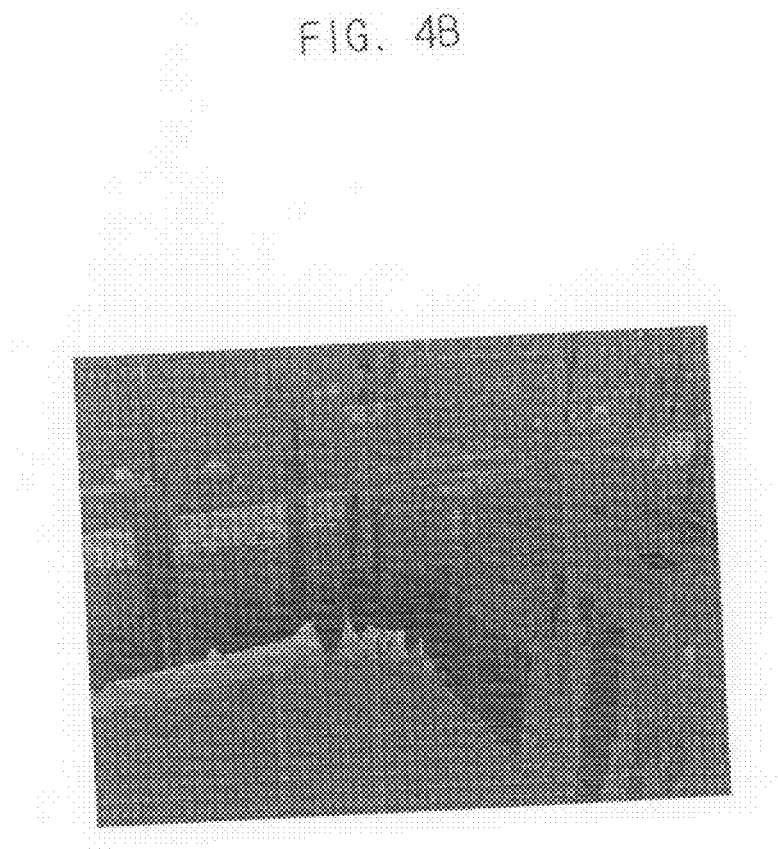

Photographs and graphs of FIGS. 4A and 4B show the result of an organic layer formed by dissolving a 0.8% concentration of polymer light emitting solution CB02T™ (available from Merck Company) in a mixture of 100 ml liquid 4-methyle-anisole dissolved with 30 g of solid bibenzyl at a normal temperature. It can be seen from FIGS. 4A and 4B that an organic layer is surrounded by barriers and is formed in an approximately rectangular region.

Figure 4C:
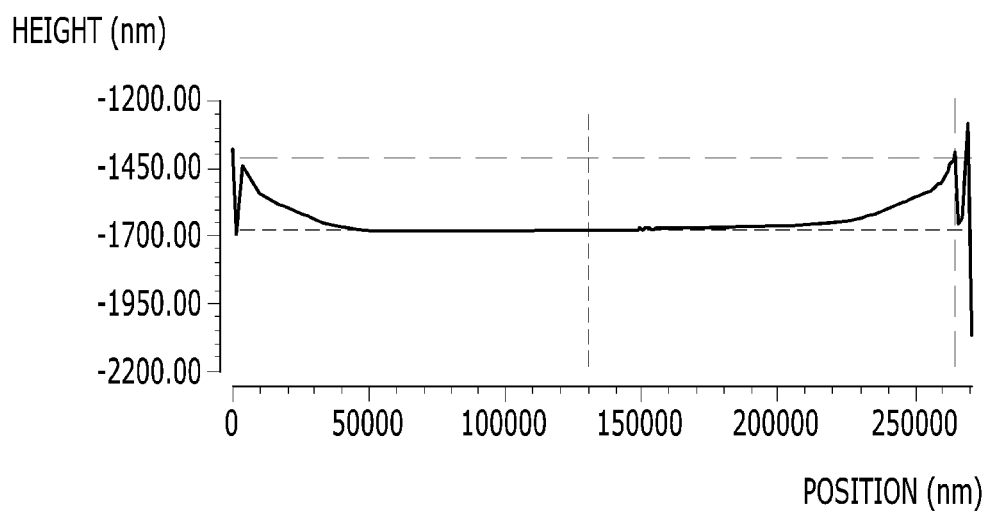

FIG. 4C shows a thickness of the organic layer in a diagonal direction as indicated in the upper right hand portion of FIG. 4A. The thickness of the organic layer is relatively regular and only portions adjacent to the barriers are somewhat thicker under the influence of the barriers.

Figure 4D:
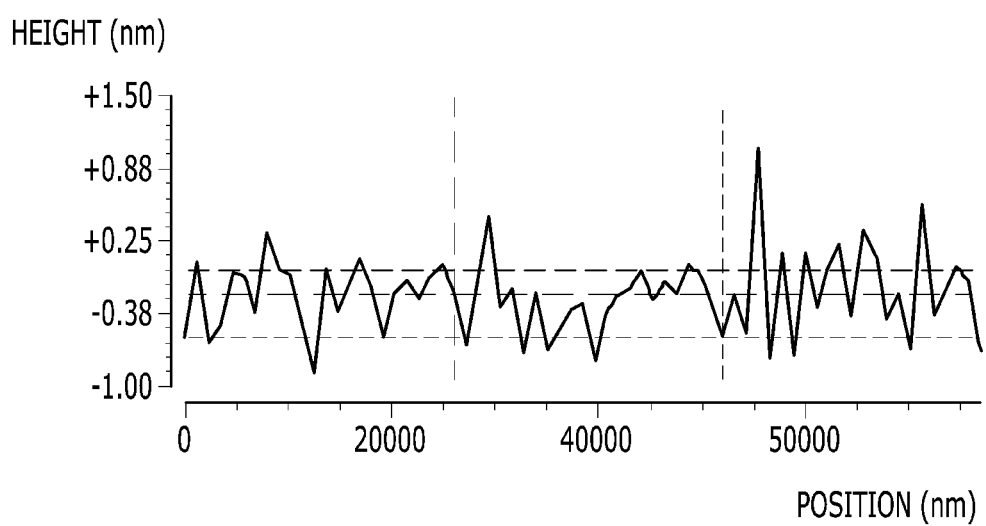

FIG. 4D shows a thickness of the organic layer in the middle portion as indicated by the delineated area of FIG. 4C. It can be seen from FIG. 4D that the thickness of the organic layer in the middle portion shows a variance of less than about 1 nm, that is, high regularity.

Hereinafter, another exemplary method of manufacturing the exemplary OLED according to the exemplary embodiment of the present invention will be described with reference to FIGS. 5A to 5G.

Figure 5A:
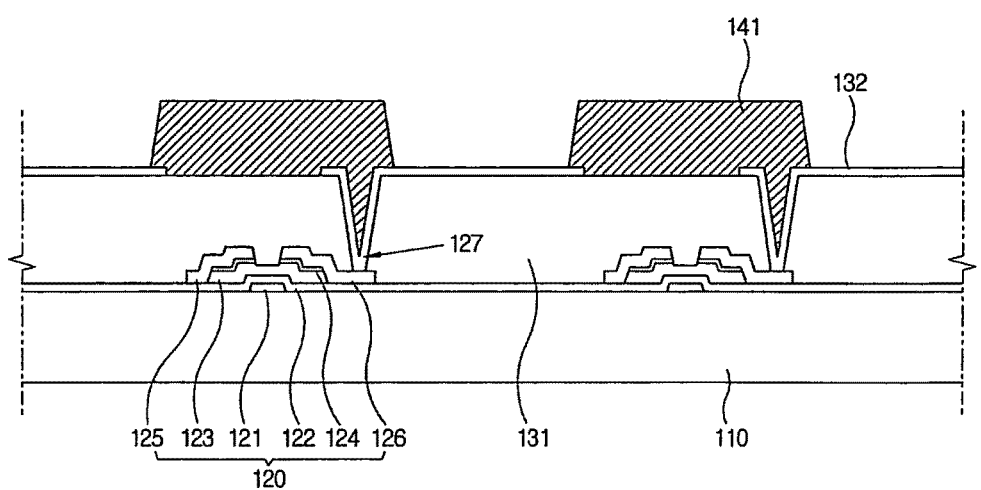
FIGS. 5A to 5G are sectional views sequentially illustrating another exemplary method of manufacturing the exemplary OLED according to an exemplary embodiment of the present invention.

To begin with, the TFT 120, the pixel electrode 132, and the barrier 141 are formed on the insulating substrate 110, as shown in FIG. 5A, and as previously described with respect to the prior embodiments.

Figure 5B:
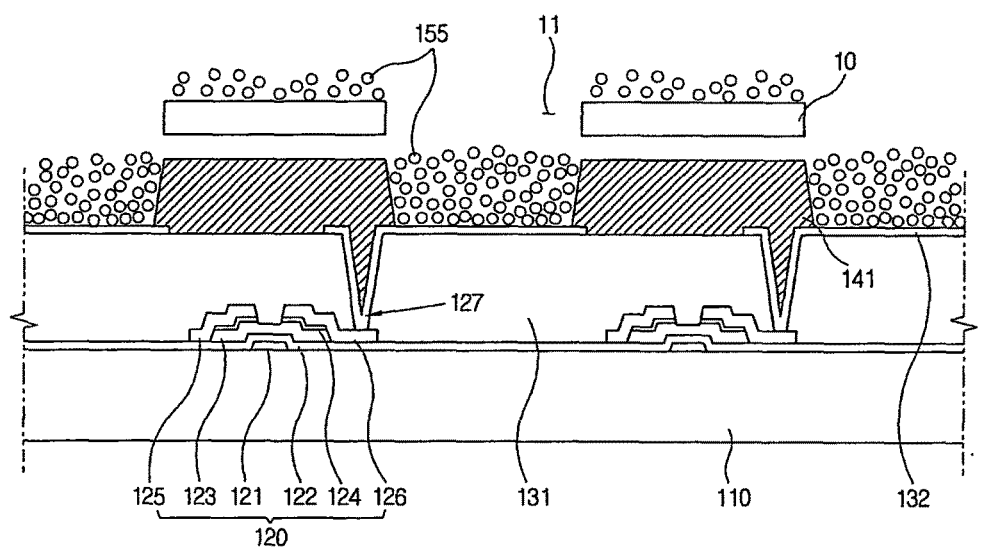
Figure 5C:
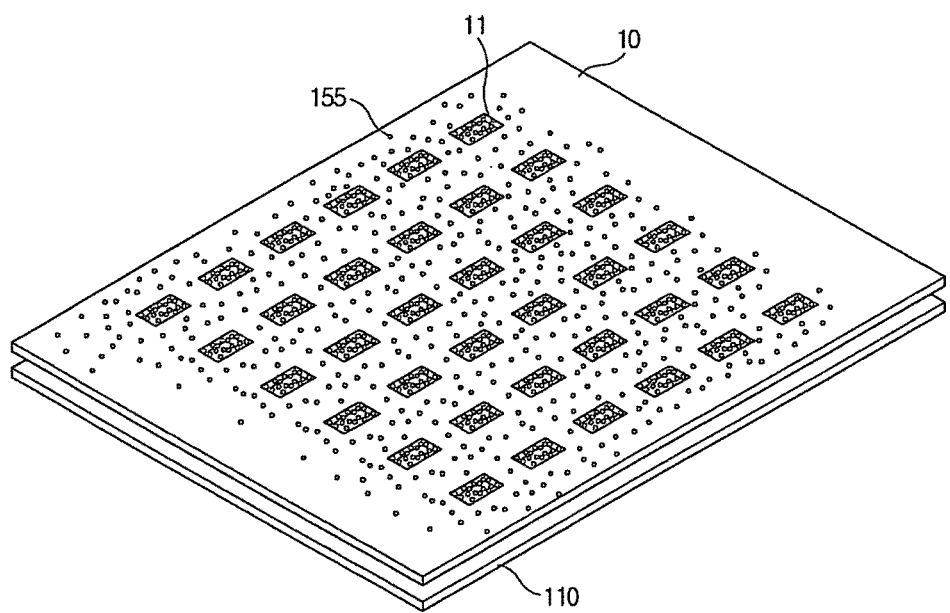

Thereafter, on the pixel electrode 132 and between the barriers 141 are placed hole injection organic material and hole injection powder 155 including the first solvent, which remains in the solid state in a temperature range between 10° C. and 30° C., using a shadow mask 10, as shown FIGS. 5B and 5C.

Details of this process are as follows.

First, the shadow mask 10 is placed on the insulating substrate 110 on which the barrier 141 is formed. The shadow mask 10 is formed with a plurality of openings 11 corresponding to the pixel electrodes 132. Next, the hole injection powder 155 is supplied on the shadow mask 10. Some of the hole injection powder 155 is placed on the pixel electrodes 132 through the openings 11, while some is placed on the shadow mask 10. The hole injection powder 155 placed on the pixel electrodes 132 is surrounded by barriers 141.

It is preferable but not necessary that the hole injection powder 155 is uniformly placed on the pixel electrodes 132. To this end, the hole injection powder 155 may be somewhat excessively supplied.

The process of placing the hole injection powder 155 on the pixel electrodes 132 is carried out at a normal temperature, such as within a temperature range of 10° C. to 30° C., thereby maintaining the hole injection powder 155 in a solid state.

The hole injection powder 155 comprises the hole injection material and the first solvent. The hole injection material and the first solvent have been described above, and therefore, description thereof will be herein omitted.

Now, a method of making the hole injection powder 155 will be described.

First, the first solvent, the hole injection material, and the second solvent, which remains in the liquid state within a temperature range of 10° C. to 30° C., are mixed to make a hole injection ink.

Thereafter, the hole injection ink is coated on a substrate, and is then heated to remove the second solvent. As a result, a solid film including the first solvent and the hole injection material is obtained. The hole injection powder 155 is obtained when the solid film is powdered into particles having a predetermined diameter. The hole injection ink may be coated on the substrate using methods such as spin coating, slit coating, etc.

The second solvent used to make the hole injection powder 155 and its usage have been described earlier, and therefore, a detailed description thereof will be herein omitted. If the boiling point of the second solvent is less than 100° C., the second solvent may be excessively volatilized. If the boiling point of the second solvent is more than 200° C., the second solvent will not be volatilized well, thereby making it difficult to obtain the solid film for preparation of the hole injection powder 155.

If the first solvent can be mixed with the hole injection material at a uniform rate, then the hole injection powder 155 may instead be made by dissolving the hole injection material into the heated up liquefied first solvent and subsequently cooling the dissolved first solvent back to a solid state.

Thereafter, the shadow mask 10 is removed from the insulating substrate 110 so that the hole injection powder 155 remains only between the barriers 141 on the pixel electrodes 132. The hole injection powder 155 placed on the shadow mask 10 may be recovered for reuse.

Figure 5D:
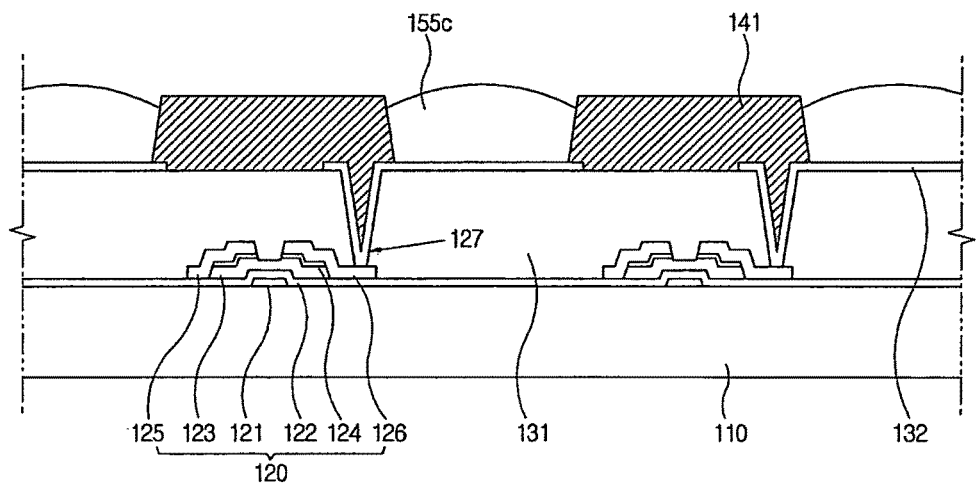
Figure 5E:
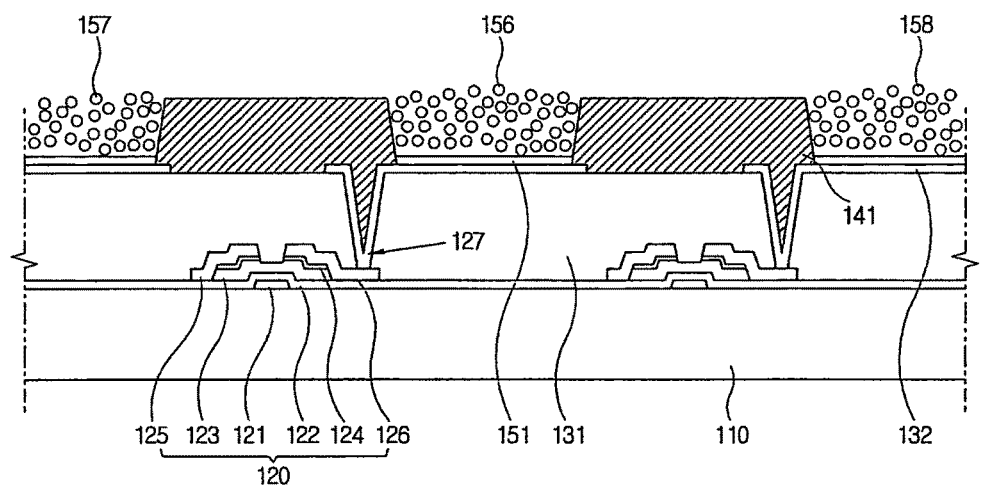

The hole injection powder 155 is then heated so that the first solvent can be liquefied, thus forming a hole injection solution 155c between the barriers 141, as shown in FIG. 5D. At this time, since the hole injection solution 155c is formed by liquefying the hole injection powder 155 at once, the volume of the hole injection solution 155c remains constant. Next, as shown in FIG. 5E, the hole injection solution 155c is dried to form the hole injection layer 151. At this time, the first solvent remaining in the liquid state is removed using a vacuum oven, preferably but not necessarily, under a vacuum atmosphere. Thus, the hole injection layer 151 formed from the hole injection solution 155c having the constant volume has regular quality.

Thereafter, light emitting powder 156, 157, and 158 is placed on the hole injection layer 151, as shown in FIG. 5E. The light emitting powder 156, 157, and 158 may be made by the same method by which the hole injection powder 155 is made, and therefore, description thereof will be herein omitted.

Figure 5F:
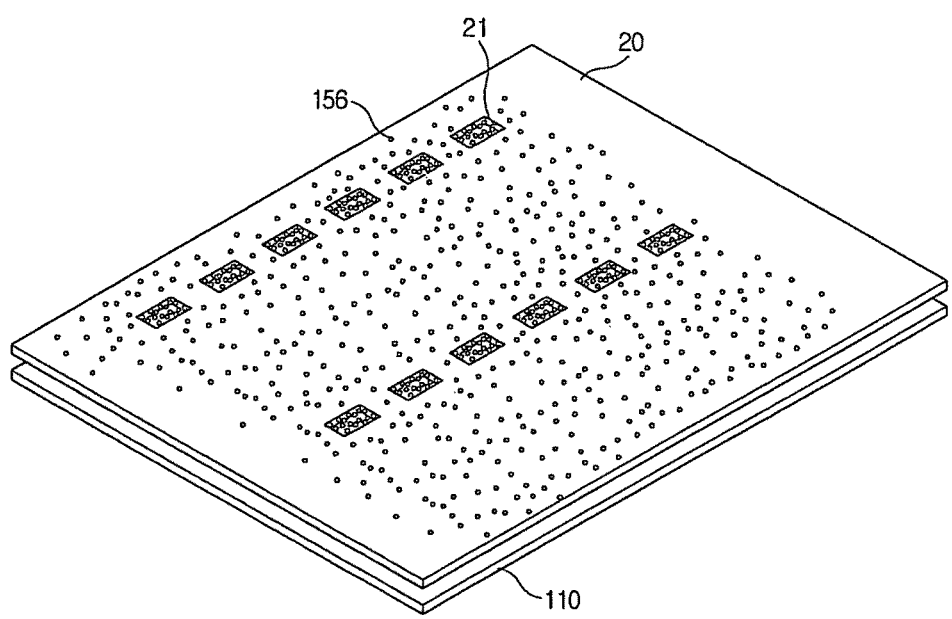

The light emitting powder 156, 157, and 158 is supplied on the hole injection layer 151 sequentially while changing the position of a shadow mask 20 shown in FIG. 5F. The shadow mask 20 is formed with openings 21, the number of which corresponds to one-third of the number of pixel electrodes 132.

Thereafter, the light emitting powder 156, 157, and 158 is formed as the red light emitting layer, the green light emitting layer, and the blue light emitting layer of the organic light emitting layer 152 through liquidation of a solvent within the light emitting power 156, 157, 158 and removal of the solvent under a vacuum atmosphere. The organic light emitting layer 152 also has regular quality like the hole injection layer 151.

Figure 5G:
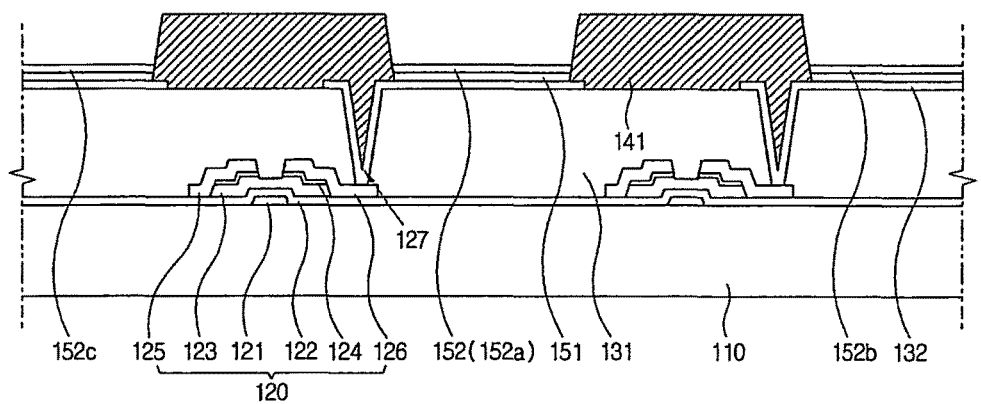

FIG. 5G illustrates the hole injection layer 151 and the organic light emitting layer 152 together formed on the pixel electrode 132.

Finally, the common electrode 161 is formed on the barrier 141 and the organic light emitting layer 152 to substantially complete the OLED 100 as shown in FIG. 2.

In the above-described embodiment, powder composition may be simultaneously placed on many or all pixel electrodes 132 to form the organic layer 150. This method significantly reduces time to form the organic layer 150 compared with the conventional inkjet method. In addition, powder composition, which is not placed on the pixel electrodes 132, and that remains on the mask 10 or mask 20, can be reused, thereby saving raw material significantly.

Hereinafter, an exemplary TFT substrate manufactured according to an exemplary embodiment of the present invention will be described with reference to FIG. 6.

Figure 6:
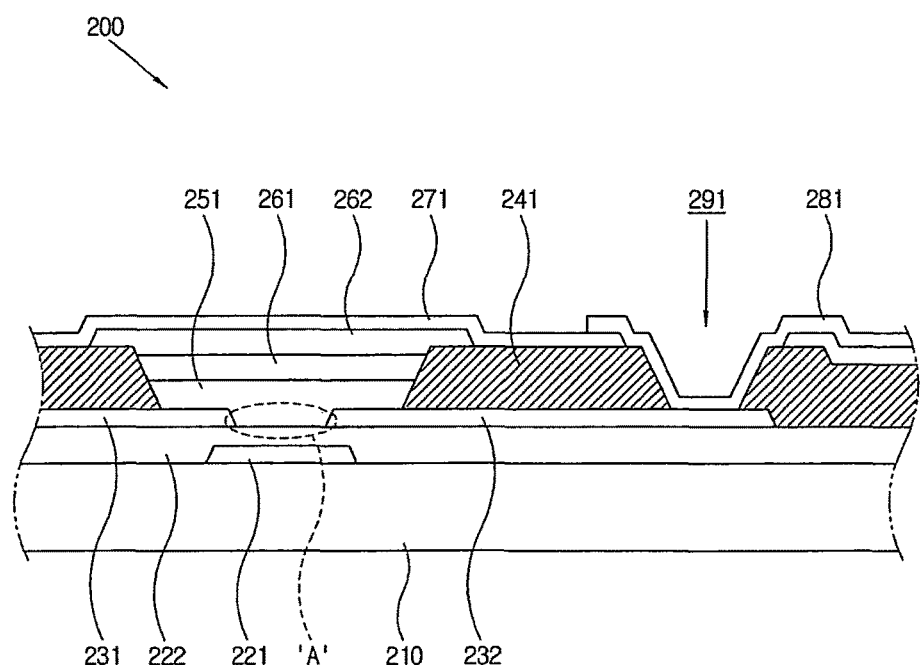
FIG. 6 is a sectional view of an exemplary thin film transistor ("TFT") substrate manufactured according to an exemplary embodiment of the present invention.

Referring to FIG. 6, a TFT substrate 200 includes an insulating substrate 210, a source electrode 231, and a drain electrode 232, which are formed on the insulating substrate 210 and isolated from each other, barriers 241 exposing portions of the source electrodes 231 and the drain electrodes 232, respectively, and an organic semiconductor layer 251 placed between the barriers 241.

The insulating substrate 210 may include glass or plastic. If the insulating substrate 210 includes plastic, it will disadvantageously be vulnerable to heat although it will advantageously be flexible. The organic semiconductor layer 251 may be formed at normal temperature and atmospheric pressure, thereby making it possible to easily use the insulating substrate 210 including plastic. The plastic may include polycarbon, polyimide, polyether sulfone ("PES"), polyarylate ("PAR"), polyethylene naphthalate ("PEN"), polyethylene terephthalate ("PET"), or etc.

A light shielding layer 221 is formed on the insulating substrate 210, and an insulating layer 222 is formed on the light shielding layer 221. The illustrated TFT is a top-gate type such that a gate electrode 262 is located over the organic semiconductor layer 251. Accordingly, the gate electrode 262 cannot block a light incident from the insulating substrate 210 into the organic semiconductor layer 251.

Thus, the light shielding layer 221 is provided to prevent an irregular performance of the TFT caused by characteristics of the organic semiconductor layer 251 changed by the incident light.

The light shielding layer 221 may include non-transparent material such as Cr or MoW. When the TFT substrate 200 is used for a liquid crystal display ("LCD") device, light from below the insulating substrate 210 may be light emitted from a backlight unit. In this figure, although it is shown that the light shielding layer 221 covers only a portion of the organic semiconductor layer 251 around a channel region A having a great effect on the TFT, the light shielding layer 221 may be formed such that it covers the entire area of the organic semiconductor layer 251.

The insulating layer 222 located on the light shielding layer 221 prevents the light shielding layer 221 from functioning as a floating electrode and planarizes the light shielding layer 221. The insulating layer 222 must have good transmittivity and good stability for subsequent processes. The insulating layer 222 may include an organic layer including benzocyclobutene ("BCB"), an acryl photosensitive layer, or a double layer of an organic layer and an inorganic layer. In the case of the double layer, the inorganic layer may include a silicon nitride layer of several hundreds Å, which prevents impurities from being introduced from the organic layer into the organic semiconductor layer 251.

The source electrode 231 and the drain electrode 232 are formed on the insulating layer 222. The source electrode 231 is isolated from the drain electrode 232 with a predetermined interval. The space between both electrodes 231 and 232 forms the channel region A. The source electrode 231 and the drain electrode 232 may be formed through deposition and etching processes.

The barriers 241 are formed on the source electrode 231, the drain electrode 232, and a portion of the insulating layer 222, which is not covered by the electrodes 231 and 232. Some of the barriers 241 surround the channel region A and expose portions of the source electrode 231 and the drain electrode 232. The barriers 241 serve as a frame of the organic semiconductor layer 251. The barriers 241 prevent the organic semiconductor layer 251 from being formed irregularly due to an anisotropical spreading of dropped organic semiconductor ink when the organic semiconductor ink is not dropped at a proper position, or the organic semiconductor ink is too large in drop size or has variance in drop sizes. That is, the barriers 241 predefine positions at which the organic semiconductor ink will be dropped for accurate performance of the inkjet process.

The barriers 241 surrounding the channel region A have a trapezoidal shape and a height of about 1 μm to 4 μm. A contact hole 291 exposing the drain electrode 232 may be provided in portions of the barriers 241.

The barriers 241 may include a photosensitive material with heat resistance and solvent resistance, such as acryl resin, polyimide resin or the like, or an inorganic material such as $SiO_2$, $TiO_2$ or the like, and may have a two-layered structure of an organic layer and an inorganic layer.

The organic semiconductor layer 251 is located between the barriers 241, covering the channel region A and the exposed portions of the source electrode 231 and the drain electrode 232.

The organic semiconductor layer 251 may be formed by the inkjet process and has a regular thickness, as will be described later.

The organic semiconductor layer 251 may include derivatives including substituents of tetracene or pentacene, or oligothiopene connected with 4, 5, 6, 7 or 8 carbons through positions 2 and 5 of thiopene ring.

The organic semiconductor layer 251 may include perylenetetracarboxlic dianhidride ("PTCDA") or its imide derivatives, or naphthalenetetracarboxlic dianhydride ("NTCDA") or its imide derivatives.

The organic semiconductor layer 251 may include metallized pthalocyanine or its halogen derivatives, or perylene or cororene or its derivatives having its substituents. Here, it is preferable but not necessary that metal to be added to metallized pthalocyanine includes copper, cobalt, zinc, etc.

The organic semiconductor layer 251 may include co-oligomer or co-polymer of thienylene and vinylene.

The organic semiconductor layer 251 may include thienylene or cororene, or its derivatives including its substituents.

The organic semiconductor layer 251 may include derivatives including at least one hydrocarbon chain having 1 to 30 carbons connected to aromatic or heteroaromatic ring of the above-mentioned derivatives.

An organic insulating layer 261 is formed on the organic semiconductor layer 251 and within the openings formed by the barrier 241. When the organic semiconductor layer 251 makes direct contact with the gate electrode 262 or faces the gate electrode 262 with an inorganic insulating layer interposed there between, a characteristic of the organic semiconductor layer 251 may be deteriorated. The organic insulating layer 261 prevents the organic semiconductor layer 251 from directly contacting the gate electrode 262 so that the characteristic of the organic semiconductor layer 251 can be maintained.

The gate electrode 262 is located on the organic insulating layer 261 on the channel region A. The gate electrode 262 may slightly overlap the barriers 241. The gate electrode 262 may include a single metal layer or multi metal layers. The gate electrode 262 may protrude from a gate line (not shown).

A passivation layer 271 is formed on the gate electrode 262 and may further overlap the barriers 241. The passivation layer 271 may include an acryl photosensitive organic layer or a silicon nitride layer. The passivation layer 271 may be removed or formed so as not be present within a drain contact hole 291 so as to expose the drain electrode 232 through the contact hole 291.

A pixel electrode 281 is formed on the passivation layer 271 and within the contact hole 291 and on the exposed drain electrode 232. The pixel electrode 281 may include a transparent conductive material such as ITO or IZO and contacts the drain electrode 232 via the drain contact hole 291.

The above-described TFT substrate 200 may be used for a display device such as an LCD, an OLED, etc.

Hereinafter, an exemplary method of manufacturing the exemplary TFT substrate according to the exemplary embodiment of the present invention will be described with reference to FIGS. 7A to 7D.

Figure 7A:
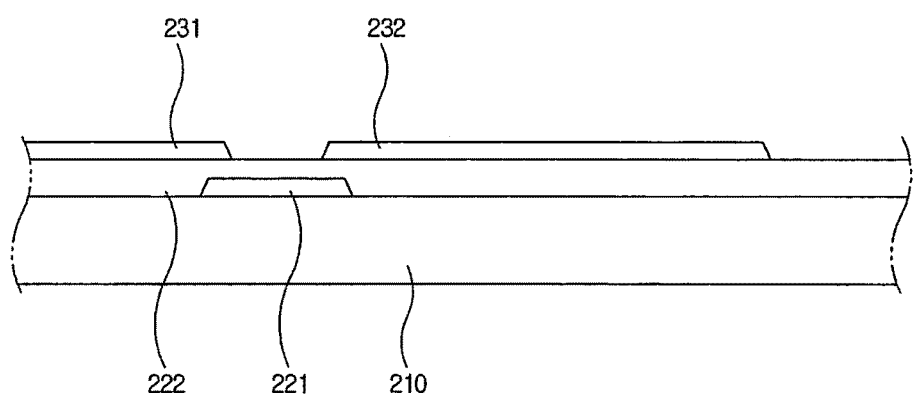
FIGS. 7A to 7D are sectional views sequentially illustrating an exemplary method of manufacturing the exemplary TFT substrate according to an exemplary embodiment of the present invention.

First, the light shielding layer 221, the insulating layer 222, the source electrode 231 and the drain electrode 232 are formed on the insulating substrate 210, as shown in FIG. 7A. The insulating substrate 210 may include glass, silicon, or plastic.

The light shielding layer 221 may be formed by depositing and etching a metal layer including Cr or MoW through a sputtering process or the like and a photolithography process, respectively.

The insulating layer 222 may be formed by a spin coating process or a slit coating process when it includes an organic layer or by a CVD process or a plasma enhanced CVD ("PECVD") process when it includes an inorganic layer.

The source electrode 231 and the drain electrode 232 may be formed by depositing a metal layer on the insulating substrate 210 by a sputtering process or the like and then etching the metal layer by a photolithography process. A data line (not shown) may further be formed during the same process, with the source electrode 231 protruding from the data line. The formed source electrode 231 and drain electrode 232 are isolated from each other, defining the channel region A.

Figure 7B:
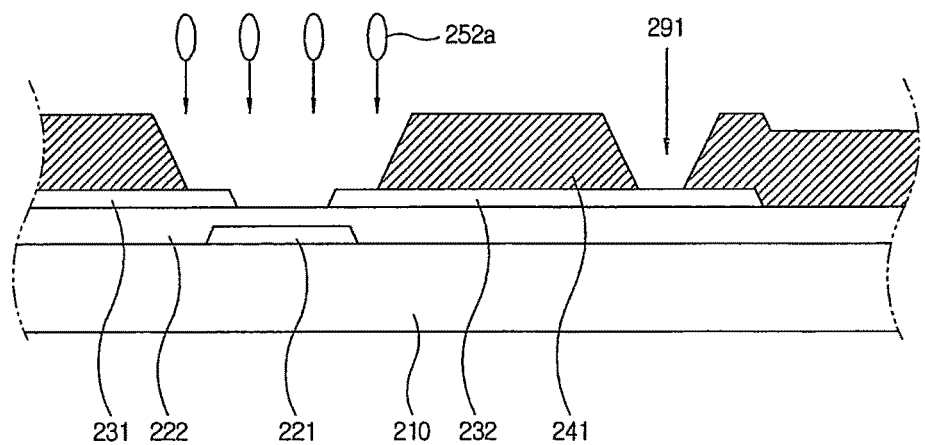

Thereafter, the barriers 241 are formed and a first organic semiconductor ink 252a is dropped between the barriers 241, as shown in FIG. 7B.

The barriers 241 may be formed by coating, exposing, and then developing a photosensitive material. Before dropping the first organic semiconductor ink 252a, it is preferable but not necessary that the barriers 241 are subject to a $CF_4$ plasma treatment so that the barriers 241 can have water/oil repellent properties.

Here, the first organic semiconductor ink 252a includes an organic semiconductor material, a first solvent, which remains in a solid state in a temperature range between 10° C. and 30° C., and a second solvent, which remains in a liquid state within a temperature range of 10° C. to 30° C. The first and second solvents may be the same as described with respect to the previously described embodiments, and have been earlier described in terms of melting point, boiling point, usage composition, etc.

The organic semiconductor material may be selected from derivatives including substituents of tetracene or pentacene; oligothiopene connected with 4, 5, 6, 7, or 8 carbons through positions 2 and 5 of thiopene ring; perylenetetracarboxlic dianhidride ("PTCDA") or its imide derivatives; naphthalenetetracarboxlic dianhydride ("NTCDA") or its imide derivatives; metallized pthalocyanine or its halogen derivatives; perylene or coroene or its derivatives having its substituents; co-oligomer or co-polymer of thienylene and vinylene; thiophene; perylene or cororene, or its derivatives including its substituents; and derivatives including at least one hydrocarbon chain having 1 to 30 carbons connected to aromatic or heteroaromatic ring of the above-mentioned material.

Figure 7C:
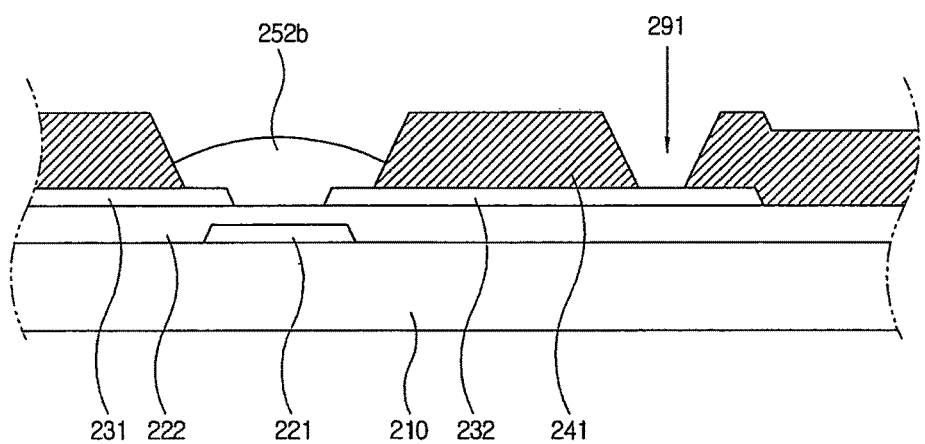

FIG. 7C shows a structure formed with a second organic semiconductor ink 252b between the barriers 241 by removing the second solvent of the first organic semiconductor ink 252a.

The second organic semiconductor ink 252b includes the first solvent and an organic semiconductor material, but does not include the second solvent.

The second organic semiconductor ink 252b with no second solvent has a regular height on a channel region A. This is because the first solvent having a low melting point is not substantially volatilized. In this condition, the second organic semiconductor ink 252b remains in a solid state and accordingly is scarcely volatilized.

Figure 7D:
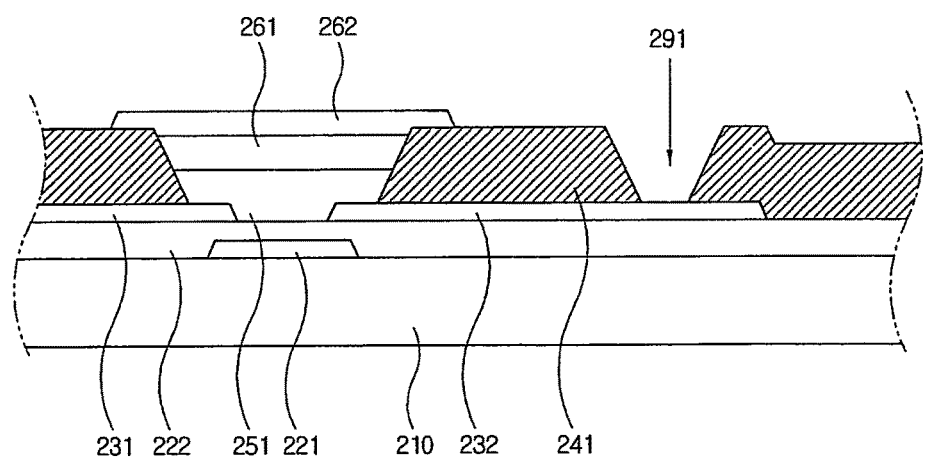

FIG. 7D shows a structure of the organic semiconductor layer 251 and the gate electrode 262 formed on the organic semiconductor layer 251 after drying the second organic semiconductor ink 252b and after forming the organic insulating layer 261 on the organic semiconductor layer 251.

The organic semiconductor layer 251 is formed when the first solvent in the second organic semiconductor ink 252b is liquefied and volatilized.

In such a process, the second organic semiconductor ink 252b remaining in the solid state is first heated. When the temperature of the second organic semiconductor ink 252b exceeds the melting point of the first solvent, the second organic semiconductor ink 252b becomes liquefied. At this time, the height (amount) of the second organic semiconductor ink 252b on the channel region A becomes regular.

Since the first solvent within the second organic semiconductor ink 252b is dried in the condition that the height of the second organic semiconductor ink 252b is regular, the organic semiconductor layer 251 is formed with uniform quality.

Finally, the passivation layer 271 is formed on the gate electrode 262 and the barriers 241, and then the pixel electrode 281 contacting the drain electrode 232 via the drain contact hole 291 is formed to complete the TFT substrate 200 as shown in FIG. 6.

Hereinafter, another exemplary method of manufacturing the exemplary TFT substrate according to the exemplary embodiment of the present invention will be described with reference to FIGS. 8A to 8D.

Figure 8A:
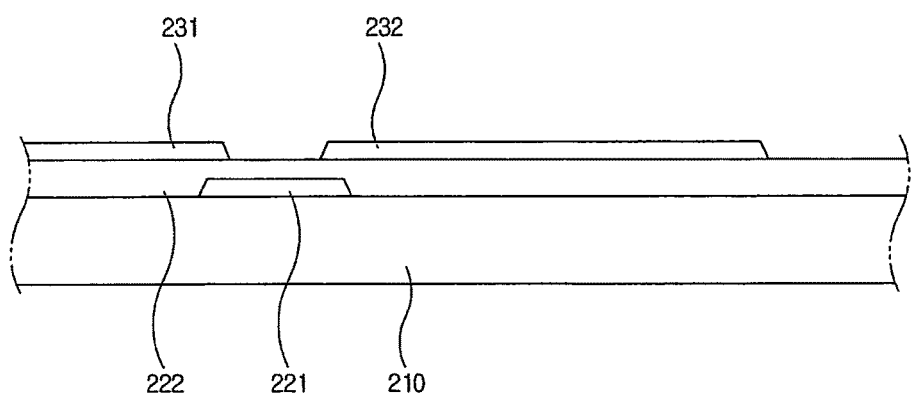
FIGS. 8A to 8D are sectional views sequentially illustrating another exemplary method of manufacturing the exemplary TFT substrate according to an exemplary embodiment of the present invention

To begin with, the light shielding layer 221, the insulating layer 222, the source electrode 231 and the drain electrode 232 are formed on the insulating substrate 210, as shown in FIG. 8A, and may be formed in a manner similar to that described with respect to the prior embodiment.

The insulating layer 222 may be formed by a spin coating process or a slit coating process when it includes an organic layer or by a CVD process or a PECVD process when it includes an inorganic layer.

Figure 8B:
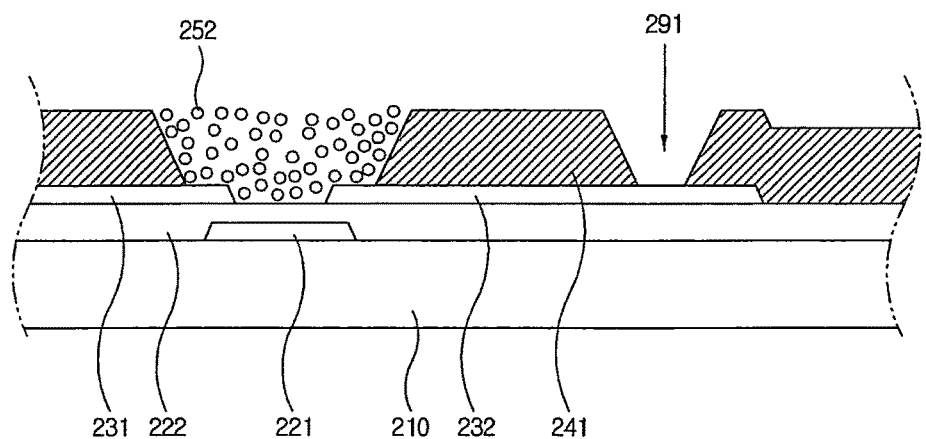

Thereafter, the barriers 241 are formed, and then organic semiconductor powder 252 is formed between the barriers 241, but not within the contact hole 291 exposing the drain electrode 232, as shown in FIG. 8B. The organic semiconductor powder 252 includes a solvent remaining in a solid state in a temperature range between 10° C. and 30° C. and an organic semiconductor material. A method of manufacturing the organic semiconductor powder 252 may be similar to the method of manufacturing the hole injection powder 155, previously described with respect to FIG. 5B, and therefore, description thereof will be herein omitted. Although not shown, the organic semiconductor powder 252 is located between the barriers 241 using a shadow mask having openings formed in areas corresponding to channel regions A. Any organic semiconductor powder 252 remaining on the shadow mask may be salvaged for use in manufacturing other TFT substrates.

Figure 8C:
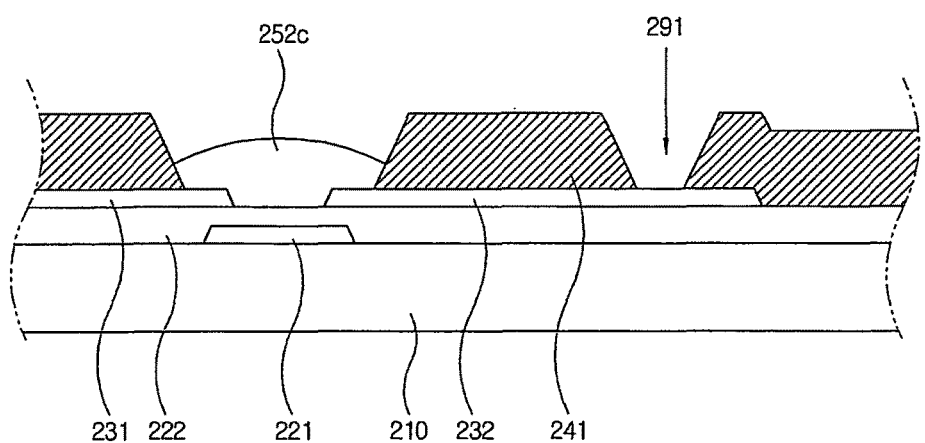

FIG. 8C shows that the organic semiconductor powder 252 is heated and liquefied to form an organic semiconductor solution 252c. Since the organic semiconductor powder 252 is located by a predetermined amount between the barriers 241 and the solvent is simultaneously liquefied, the amount of the organic semiconductor solution 252c becomes regular.

Figure 8D:
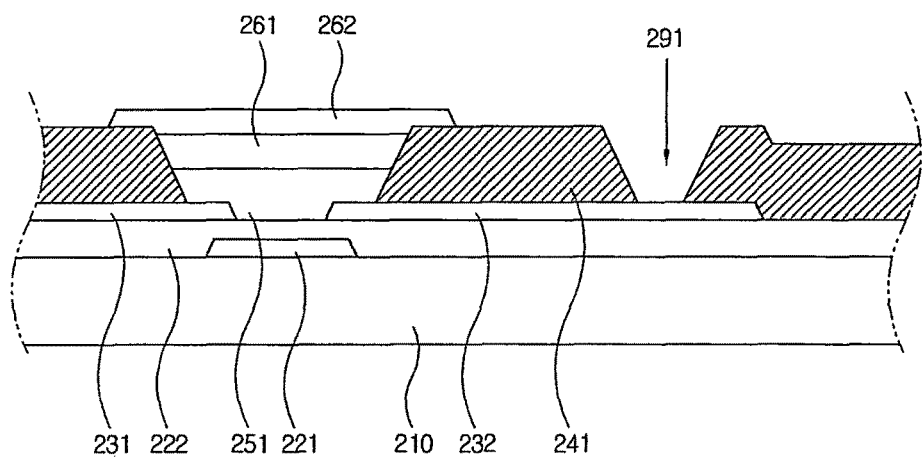

FIG. 8D shows a structure of the organic semiconductor layer 251 and the gate electrode 262 after drying the organic semiconductor solution 252c and after forming the organic insulating layer 261 on the organic semiconductor layer 251. The organic semiconductor layer 251 is formed when the solvent in the organic semiconductor solution 252c is volatilized under a vacuum state.

Since the solvent is volatilized in a condition that the organic semiconductor solution 252c is constant, quality of the organic semiconductor layer 251 becomes regular.

Finally, the passivation layer 271 is formed on the gate electrode 262 and the barriers 241, and then the pixel electrode 281 is formed to contact the drain electrode 231 via the drain contact hole 291 to complete the TFT substrate 200 as shown in FIG. 6.

Hereinafter, an LCD device 300 manufactured according to an exemplary embodiment of the present invention will be described with reference to FIGS. 9 and 10.

Figure 9:
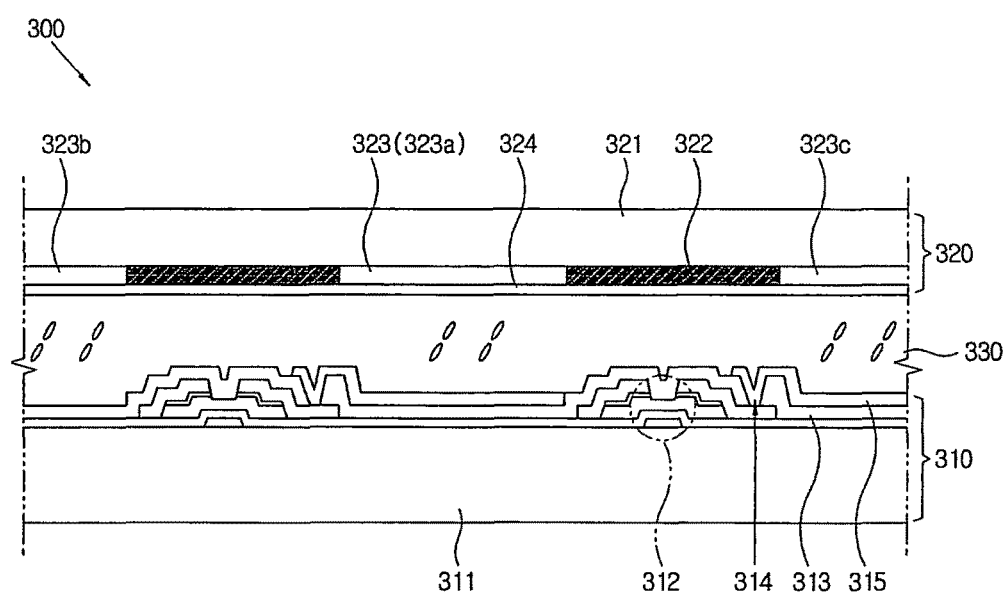
FIG. 9 is a sectional view of an exemplary liquid crystal display ("LCD") device manufactured according to an exemplary embodiment of the present invention.
Figure 10:
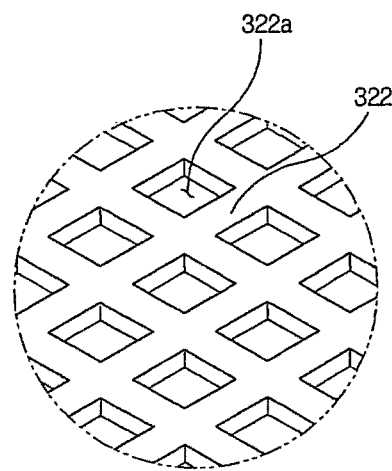
FIG. 10 is a perspective view of a portion of an exemplary black matrix in the exemplary LCD device manufactured according to an exemplary embodiment of the present invention.

Referring to FIGS. 9 and 10, the LCD device 300 manufactured according to the exemplary embodiment of the present invention includes a TFT substrate 310, a color filter substrate 320, and a liquid crystal layer 330 interposed between both substrates 310 and 320.

In the TFT substrate 310, a plurality of TFTs 312 are formed on an insulating substrate 311. The TFTs 312 are covered by a passivation layer 313. A portion of the passivation layer 313 is removed to form a contact hole 314 to expose a drain electrode of each of the TFTs 312. A pixel electrode 315 including a transparent conductive material is connected to the TFTs 312 via the contact hole 314.

In the color filter substrate 320, black matrices 322 are formed in the form of a lattice on an insulating substrate 321. The black matrices 322 may include an organic material including a black pigment. The black matrices 322 are formed corresponding to the TFTs 312 and wirings (not shown) of the TFT substrate 310.

A color filter layer 323 is formed in openings 322a of the black matrices 322. The color filter layer 323 includes an organic material and includes three sub layers 323a, 323b, and 323c having different colors. A common electrode 324 including a transparent conductive material is formed on the black matrices 322 and the color filter layer 323.

The arrangement of liquid crystals in the liquid crystal layer 330 interposed between both substrates 310 and 320 is controlled by an electric field produced by the pixel electrode 315 and the common electrode 324. Light from below the TFT substrate 310, such as from a backlight assembly, will have a color while passing through the color filter layer 323 after the transmissivity of the light is adjusted in the liquid crystal layer 330.

FIGS. 11A to 11D illustrate the formation of the color filter layer 323.

Figure 11A:
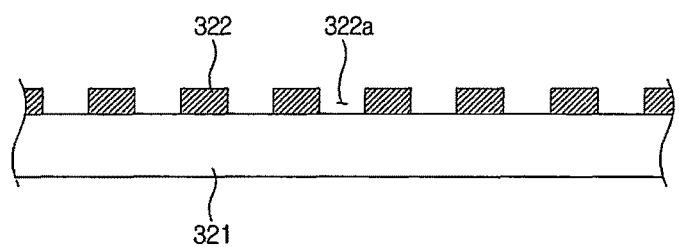
FIGS. 11A to 11D are sectional views sequentially illustrating an exemplary method of manufacturing the exemplary LCD device according to an exemplary embodiment of the present invention.

First, the black matrices 322 are formed in the form of a lattice on the insulating substrate 321, as shown in FIG. 11A. The black matrices 322 may be formed by coating, exposing, and developing a photosensitive layer including a black pigment. The black matrices 322 include openings 322 exposing the insulating substrate 321.

Figure 11B:
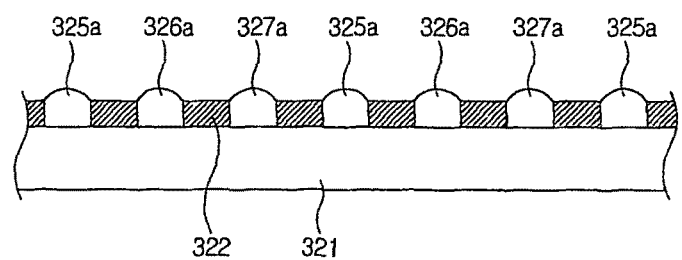

Next, first color filter inks 325a, 326a, and 327a including a color filter organic material are dropped into the openings 322a, as shown in FIG. 11B. The color filter inks 325a, 326a, and 327a may be sequentially dropped within the openings 322a.

Here, the first color filter inks 325a, 326a, and 327a include an organic semiconductor material, a first solvent, which remains in a solid state at a temperature of 10° C. to 30° C., and a second solvent, which remains in a liquid state at a temperature of 10° C. to 30° C. The first and second solvents may be the same as those used in the prior embodiments and have been earlier described in terms of melting point, boiling point, usage, etc.

Figure 11C:
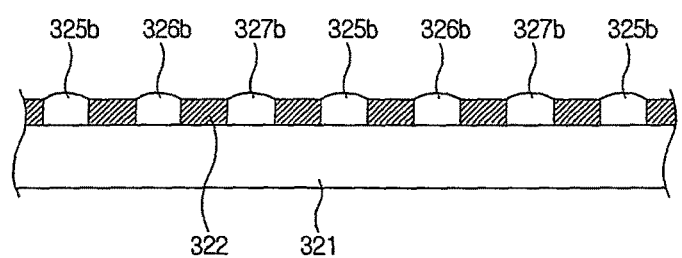

FIG. 11C shows that the second solvent from the first color filter inks 325a, 326a, 327a is removed and then the second color filter inks 325b, 326b, and 327b are formed within the openings 322a between the black matrices 322. The second color filter inks 325b, 326b and 327b include the first solvent and an organic semiconductor material, but do not include the second solvent.

The second color filter inks 325b, 326b, and 327b with no second solvent have a regular height in the openings 322a. This is because the first solvent having a low melting point is not substantially volatilized. In this condition, the second color filter inks 325b, 326b, and 327b remain in a solid state and accordingly are scarcely volatilized.

Figure 11D:
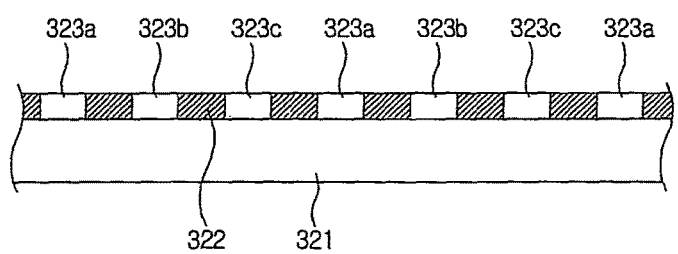

FIG. 11D shows that the color filter layer 323, including a red color filter 323a, a green color filter 323b, and a blue color filter 323c, is formed by drying the second color filter inks 325b, 326b, and 327b.

The color filter layer 323 is formed when the first solvent in the second color filter inks 325b, 326b, and 327b is liquefied and volatilized.

First, the second color filter inks 325b, 326b, and 327b remaining in the solid state is heated. When the temperature of the second color filter inks 325b, 326b, and 327b exceeds the melting point of the first solvent, the second color filter inks 325b, 326b, and 327b are liquefied. At this time, the height (amount) of the second color filter inks 325b, 326b and 327b in the openings 222a becomes regular.

Since the first solvent is dried in the condition that the height of the second color filter inks 325b, 326b, and 327b is regular, the color filter layer 323 is formed with uniform quality.

Finally, the common electrode 324 is formed on the black matrices 322 and the color filter layer 323, thereby completing the color filter substrate 320 as shown in FIG. 9.

Hereinafter, another exemplary method of manufacturing the exemplary LCD device according to the exemplary embodiment of the present invention will be described with reference to FIGS. 12A to 12D.

Figure 12A:
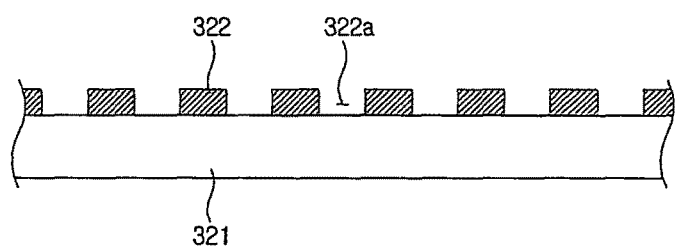
FIGS. 12A to 12D are sectional views sequentially illustrating another exemplary method of manufacturing the exemplary LCD device according to an exemplary embodiment of the present invention.

To begin with, the black matrices 322 are formed in the form of a lattice on the insulating substrate 321, as shown in FIG. 12A, in a manner substantially the same as in the previous exemplary embodiment.

Figure 12B:
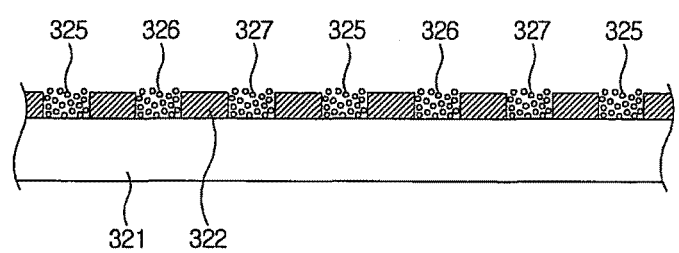

Next, color filter powders 325, 326, and 327 are supplied in the openings 322a of the black matrices 322, as shown in FIG. 12B. The color filter powders 325, 326, and 327 include a solvent remaining in a solid state in a temperature range between 10° C. and 30° C. and an organic color filter material. A method of manufacturing the color filter powders 325, 326, and 327 is similar to the method of manufacturing the hole injection powder 155, and therefore, description thereof will be herein omitted.

Although not shown, the color filter powders 325, 326, and 327 are formed in the openings 322a while moving a shadow mask in which openings, the number of which corresponds to one-third of the number of the openings 322a of the black matrices 322, are formed. The mask may be similar to the mask 20 shown in FIG. 5F.

Figure 12C:
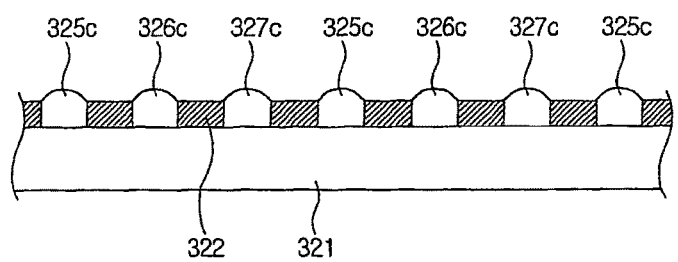

FIG. 12C shows that the solvent is liquefied to form color filter solutions 325c, 326c, and 327c. Since the color filter powders 325, 326, and 327 are located by a predetermined amount between the black matrices 322 and the solvent is simultaneously liquefied, the amount of the color filter solutions 325c, 326c, and 327c becomes regular.

Figure 12D:
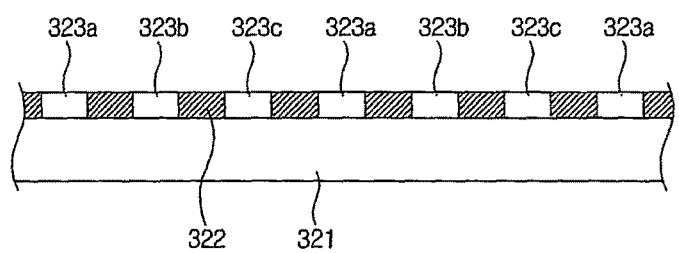

FIG. 12D shows that the color filter solutions 325c, 326c, and 327c are dried to form the color filter layer 323 including the red color filter 323a, the green color filter 323b, and the blue color filter 323c.

The color filter layer 323 is formed when the solvent in the color filter solutions 325c, 326c, and 327c is volatilized under a vacuum atmosphere.

Since the solvent is volatilized in a condition that the amount of the color filter solutions 325c, 326c, and 327c is constant, quality of the color filter layer 323 becomes regular.

Finally, the common electrode 321 is formed on the black matrices 322 and the color filter layer 323, thereby completing the color filter substrate 320 shown in FIG. 9.

As apparent from the above description, the present invention provides a display device with an organic layer of regular quality, and a method of manufacturing the display device. For example, the organic layer may have a uniform thickness at each of its locations on a surface of the display device, such as within each organic layer of an OLED, each organic semiconductor layer of a TFT substrate, or each color filter layer of a color filter substrate.

Also, the present invention provides composition for use in manufacturing a display device with an organic layer of regular quality.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A method of manufacturing a display device, the method comprising:
   making an ink composition comprising a mixture of a first solvent which remains in a solid state in a temperature range between 10° C. and 30° C., a second solvent which remains in a liquid state in a temperature range between 10° C. and 30° C., and an organic material;
   volatilizing the second solvent in the ink composition such that the first solvent is transformed into a solid state; and
   heating the first solvent in the solid state such that the first solvent is liquefied and volatilized to form an organic layer,
   wherein before volatilizing the second solvent in the ink composition, the first solvent is dissolved into the second solvent.

2. The method according to claim 1, further comprising forming pixel electrodes on an insulating substrate,
   wherein the organic layer is formed on the pixel electrodes.

3. The method according to claim 2, further comprising at least partially surrounding the pixel electrodes by barriers.

4. The method according to claim 1, wherein volatilizing the first solvent includes volatilizing the first solvent in a vacuum state.

5. An ink composition for use in manufacturing a display device, the ink composition comprising:
   a first solvent which remains in a solid state in a temperature range between 10° C. and 30° C.;
   a second solvent which remains in a liquid state in a temperature range between 10° C. and 30° C.; and
   an organic material formed by the first solvent in the solid state such that the first solvent is liquefied and volatilized to form the organic layer,
   wherein the first solvent ranges from 10 to 150 parts by weight with respect to 100 parts by weight of the second solvent.

6. The ink composition according to claim 5, wherein a melting point of the first solvent ranges from 30° C. to 200° C.

7. The ink composition according to claim 5, wherein a boiling point of the first solvent ranges from 200° C. to 500° C.

8. The ink composition according to claim 5, wherein a boiling point of the second solvent ranges from 100° C. to 200° C.

9. The ink composition according to claim 5, wherein the first solvent ranges from 20 to 40 parts by weight with respect to 100 parts by weight of the second solvent.

10. The ink composition according to claim 5, wherein the first solvent comprises at least one of bibenzyl, 2,5-dibromo-p-xylene, 3,5-dibromo-toluene, 2-chloro-5-methylphenol, 4-chloro-2-methylphenol, 3-chloro-3-methylphenol, 5-chloro-2-methylphenol, 1-phenylpyrrole, 4H-pyran-4-one, 2,4,6-trichloropyrimidine, 2,3,4-trimethyl-1,3-pentanediol, dicafluorobiphenyl, 1,4-di-tert-butylbenzene, 2,6-di-tert-butyl-4-ethylphenol, 2,6-di-tert-butyl-ethylphenol, 2,6-di-tert-butylphenol, 2,4-di-tert-butylphenol, 2,5-dichloroaniline, and 3,5-dichlorocatechol.

11. The ink composition according to claim 5, wherein the second solvent comprises at least one of tetrahydrofuran, chloroform, N,N-dimethylformamide, 4-methylheptane, 1,4-dioxane, 1-propanol, cyclohexanone, decane, propylene carbonate, nonane, 4-methyl anisole, toluene, tetralin, diphenylether, 1,3-dichorobenzene, 2-pyrrolidone, aniline, benzene, benzonitrile, bromobenzene, chlorobenzene, cyclohexylbenzene, ethylbenzene, mesitylene, methylbenzonate, nitrobenzene, pyridine, and quinoline.

12. The ink composition according to claim 5, wherein the organic material comprises at least one of a hole injection material and an organic light emitting material.

13. The ink composition according to claim 5, wherein the organic material comprises at least one of derivatives comprising substituents of tetracene or pentacene; oligothiopene connected with 4, 5, 6, 7, or 8 carbons through positions 2 and 5 of thiopene ring; perylenetetracarboxlic dianhidride or its imide derivatives; naphthalenetetracarboxlic dianhydride or its imide derivatives; metallized pthalocyanine or its halogen derivatives; perylene or coroene or its derivatives having its substituents; co-oligomer or co-polymer of thienylene and vinylene; thiophene; thienylene or coroene, or its derivatives comprising its substituents; and derivatives comprising at least one hydrocarbon chain having 1 to 30 carbons connected to aromatic or heteroaromatic ring of the materials.

* * * * *